US011360312B2

(12) United States Patent
Choi et al.

(10) Patent No.: US 11,360,312 B2
(45) Date of Patent: Jun. 14, 2022

(54) DISPLAY DEVICE AND HEAD MOUNT DISPLAY DEVICE

(71) Applicant: Samsung Display Co., Ltd., Yongin-si (KR)

(72) Inventors: Chung Sock Choi, Seoul (KR); Hyun Ho Kim, Hwaseong-si (KR); So Young Lee, Suwon-si (KR); Sang Hwan Cho, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/004,762

(22) Filed: Aug. 27, 2020

(65) Prior Publication Data

US 2020/0393684 A1 Dec. 17, 2020

Related U.S. Application Data

(63) Continuation of application No. 16/042,518, filed on Jul. 23, 2018, now Pat. No. 10,782,529.

(30) Foreign Application Priority Data

Sep. 22, 2017 (KR) .................. 10-2017-0122646

(51) Int. Cl.
*G02B 27/01* (2006.01)
*G02B 27/09* (2006.01)
(Continued)

(52) U.S. Cl.
CPC ....... *G02B 27/0172* (2013.01); *G02B 5/0215* (2013.01); *G02B 5/18* (2013.01);
(Continued)

(58) Field of Classification Search
CPC .... G02B 27/0172; G02B 5/18; G02B 5/1871; G02B 5/28; G02B 5/189; G02B 5/0215;
(Continued)

(56) References Cited

U.S. PATENT DOCUMENTS 9,081,248 B2   7/2015   Noh et al.
10,254,452 B2  4/2019   Noh et al.
(Continued)

FOREIGN PATENT DOCUMENTS

CN   106324897   1/2017
JP   01093702    4/1989
(Continued)

OTHER PUBLICATIONS

Partial European Search Report—European Patent No. 18195856.2 dated Feb. 22, 2019, citing references listed within.
(Continued)

*Primary Examiner* — Grant Sitta
(74) *Attorney, Agent, or Firm* — Cantor Colburn LLP

(57) ABSTRACT

A display device includes a display panel including a substrate and a plurality of display elements disposed on the substrate, and a diffraction panel including a plurality of diffraction patterns disposed on a path of light emitted from the plurality of display elements. The plurality of diffraction patterns are disposed in a first direction to have a first period, each of the plurality of diffraction patterns includes a first refractive layer, a second refractive layer disposed on the first refractive layer, and a third refractive layer disposed on the second refractive layer, and a refractive index of the second refractive layer is higher than a refractive index of the first refractive layer and a refractive index of the third refractive layer.

20 Claims, 38 Drawing Sheets

(51) Int. Cl.

| | |
|---|---|
| *H01L 51/52* | (2006.01) |
| *H01L 27/32* | (2006.01) |
| *H01L 51/50* | (2006.01) |
| *G02B 5/18* | (2006.01) |
| *G02B 5/28* | (2006.01) |
| *G02B 5/02* | (2006.01) |
| *G02B 1/115* | (2015.01) |

(52) U.S. Cl.
CPC ........... *G02B 5/189* (2013.01); *G02B 5/1871* (2013.01); *G02B 5/28* (2013.01); *G02B 27/0944* (2013.01); *G02B 27/0955* (2013.01); *H01L 27/3246* (2013.01); *H01L 51/5036* (2013.01); *H01L 51/5203* (2013.01); *H01L 51/524* (2013.01); *G02B 1/115* (2013.01); *G02B 2027/0112* (2013.01); *G02B 2027/0123* (2013.01)

(58) Field of Classification Search
CPC ........... G02B 27/0955; G02B 27/0944; G02B 2027/0112; G02B 1/115; G02B 2027/0123; G02B 27/017; G02B 27/42; H01L 51/524; H01L 51/5203; H01L 27/3246; H01L 51/5036; H01L 27/3232; H01L 51/5275; H01L 51/5237; H01L 51/5293

See application file for complete search history.

(56) References Cited

U.S. PATENT DOCUMENTS

| | | | |
|---|---|---|---|
| 10,969,740 B2* | 4/2021 | Shi .................. G03H 1/2294 | |
| 2006/0175962 A1 | 8/2006 | Fujimoto et al. | |
| 2009/0116790 A1 | 5/2009 | Mossberg et al. | |
| 2010/0020045 A1* | 1/2010 | Walsh ................ G06F 3/0412 | 345/176 |
| 2010/0123681 A1 | 5/2010 | Wu et al. | |
| 2010/0309150 A1 | 12/2010 | Lee et al. | |
| 2012/0242565 A1 | 9/2012 | Noh et al. | |
| 2013/0037815 A1 | 2/2013 | Okajima et al. | |
| 2013/0135256 A1 | 5/2013 | Hong et al. | |
| 2014/0160377 A1 | 6/2014 | Yamagishi et al. | |
| 2014/0347609 A1* | 11/2014 | Li ...................... G02B 5/1819 | 349/99 |
| 2014/0362033 A1 | 12/2014 | Mo et al. | |
| 2015/0188086 A1* | 7/2015 | Hou .................... G02B 5/285 | 257/40 |
| 2016/0097881 A1* | 4/2016 | Yang ................. H01L 51/5281 | 359/488.01 |
| 2016/0190479 A1 | 6/2016 | Hara et al. | |
| 2016/0209958 A1 | 7/2016 | Choi et al. | |
| 2016/0266387 A1 | 9/2016 | Tekolste et al. | |
| 2018/0275350 A1 | 9/2018 | Oh et al. | |
| 2018/0350883 A1* | 12/2018 | Lee .................... G06F 3/0446 | |
| 2019/0044069 A1* | 2/2019 | Nishida .............. H01L 51/001 | |

FOREIGN PATENT DOCUMENTS

| | | |
|---|---|---|
| JP | 11014814 | 1/1999 |
| JP | 2003057442 | 2/2003 |
| KR | 1020120108565 | 10/2012 |
| KR | 101567688 | 11/2015 |
| KR | 1020170065484 | 6/2017 |
| KR | 1020180121750 | 11/2018 |

OTHER PUBLICATIONS

Korean Office Action—Korean Application No. 10-2017-0122646 dated Mar. 14, 2022.

* cited by examiner (a)

(b)

TA1R

TA2R

TA1G

TA2G

TA1B

TA2B

DISPLAY DEVICE AND HEAD MOUNT DISPLAY DEVICE

This application is a continuation of U.S. patent application Ser. No. 16/042,518, filed on Jul. 23, 2018, which claims priority to Korean Patent Application No. 10-2017-0122646, filed on Sep. 22, 2017, and all the benefits accruing therefrom under 35 U.S.C. § 119, the content of which in its entirety is herein incorporated by reference.

BACKGROUND

1. Field

Exemplary embodiments of the invention relate to a display device and a head mount display device.

2. Description of the Related Art

Display devices are becoming increasingly important with the development of multimedia. In response to this, various types of display devices such as a liquid crystal display ("LCD"), an organic light-emitting diode ("OLED") display, and the like are being used.

Among the display devices, the OLED display displays an image using an OLED that generates light by recombining electrons and holes. The OLED display has a high response speed, a high luminance, a wide viewing angle, and low power consumption.

A head mount display device may be mounted on a user's head, and may have a form of a pair of glasses, a helmet, or the like. The head mount display device displays an image in front of user's eyes so that the user may recognize the image.

SUMMARY

Exemplary embodiments of the invention provide a display device capable of increasing an effective light emission area ratio, and a head mount display device.

In addition, exemplary embodiments of the invention provide a display device capable of reducing reflectance due to external light, and a head mount display device.

Further, exemplary embodiments of the invention provide a display device capable of minimizing a degree of visual blurring recognition, and a head mount display device.

Furthermore, exemplary embodiments of the invention provide a head mount display device capable of improving a screen door effect.

It should be noted that objects of the invention are not limited to the above-described objects, and other objects of the invention will be apparent to those skilled in the art from the following descriptions.

An exemplary embodiment of the invention discloses a display device including a display panel including a substrate and a plurality of display elements disposed on the substrate, and a diffraction panel including a plurality of diffraction patterns disposed on a path of light emitted from the plurality of display elements. The plurality of diffraction patterns may be disposed in a first direction to have a first period, each of the plurality of diffraction patterns comprises a first refractive layer, a second refractive layer disposed on the first refractive layer, and a third refractive layer disposed on the second refractive layer, and a refractive index of the second refractive layer may be higher than a refractive index of the first refractive layer and a refractive index of the third refractive layer.

An exemplary embodiment of the invention also discloses a display device including a substrate, a display panel including a plurality of display elements disposed on the substrate, and a diffraction panel including a plurality of diffraction patterns disposed on a path of light emitted from the plurality of display elements. The plurality of diffraction patterns may be disposed in a first direction to have a first period, each of the plurality of diffraction patterns may include a first layer and a second layer disposed on the first layer, and a refractive index of the first layer may be higher than a refractive index of the second layer.

An exemplary embodiment of the invention also discloses a head mount display device including a display unit including a plurality of display elements and a plurality of diffraction patterns disposed on a path of light emitted from the plurality of display elements, and a lens unit disposed on a path of light emitted from the display unit. The plurality of diffraction patterns may be disposed in a first direction to have a first period, each of the plurality of diffraction patterns includes a first refractive layer, a second refractive layer disposed on the first refractive layer, and a third refractive layer disposed on the second refractive layer, and a refractive index of the second refractive layer may be higher than refractive indexes of the first refractive layer and the third refractive layer.

BRIEF DESCRIPTION OF THE DRAWINGS

The above and other features of the invention will become more apparent by describing exemplary embodiments thereof in detail with reference to the attached drawings, in which.

DETAILED DESCRIPTION

Figure 1A:
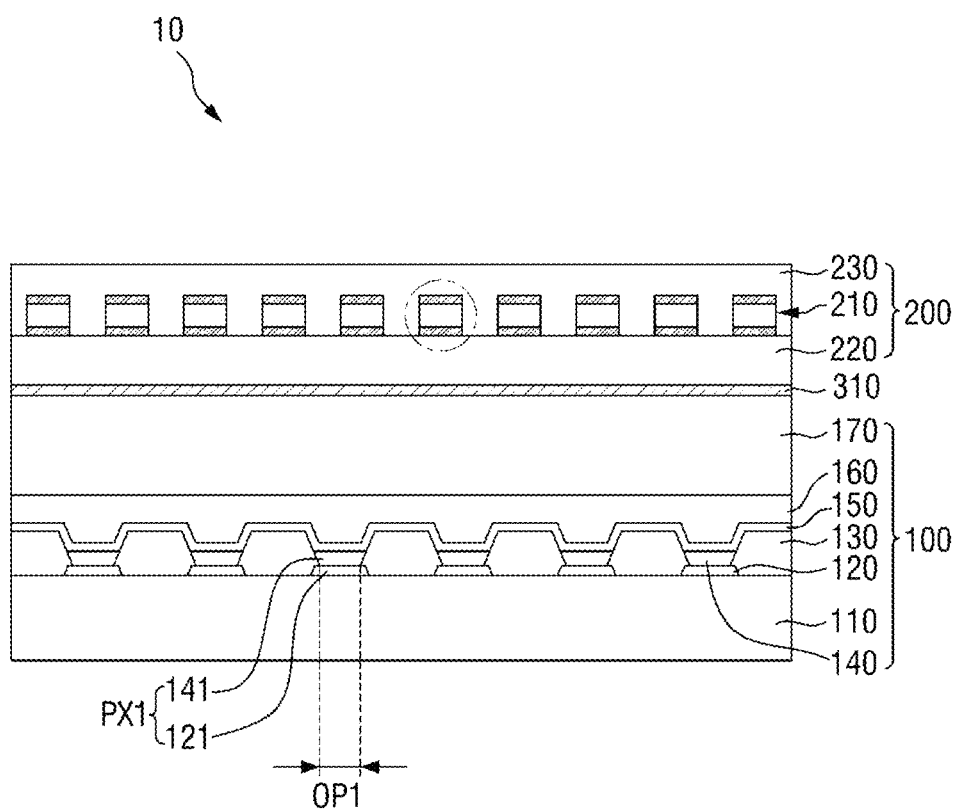
FIG. 1A is a cross-sectional view schematically illustrating an exemplary embodiment of a display device according to the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying drawing figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region provided by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

Figure 1B:
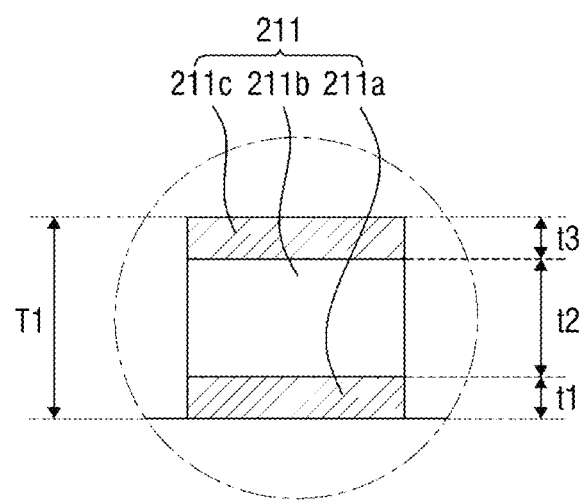
FIG. 1B is an enlarged view of a portion of the display device.

FIG. 1A is a cross-sectional view schematically illustrating a display device according to an exemplary embodiment of the invention, and FIG. 1B is an enlarged view of a portion of the display device.

Referring to FIG. 1A, a display device 10 according to the exemplary embodiment of the invention may include a display panel 100 and a diffraction panel 200. In this specification, a component which is coupled to another component through an adhesive member is expressed as a "panel." In addition, a component which is provided through a continuous process with another component is expressed as a "layer." The panel includes a base layer providing a base surface. In contrast, in a layer, a base layer may be omitted. That is, when a component is expressed as a "layer," the component may be disposed on a base surface provided by another component. Here, in an exemplary embodiment, the base layer may include a synthetic resin film, a composite material film, a glass substrate, or the like, for example.

The display panel 100 is defined as a panel which displays an image. To this end, the display panel 100 may include a plurality of display elements. Here, in an exemplary embodiment, the plurality of display elements may be organic light-emitting diodes ("OLEDs"). Accordingly, the display panel 100 may be an OLED display panel. However, a type of the display panel 100 is not limited to the OLED display panel and may vary according to a type of the display element. In an exemplary embodiment, the display panel 100 may be a quantum dot display panel, a liquid crystal display ("LCD") panel, or the like, for example. Hereinafter, the display panel 100 will be described as an OLED display panel, for example.

A first substrate 110 may be an insulating substrate. In an exemplary embodiment, the first substrate 110 may include a material such as glass, quartz, a polymer resin, or the like. In an exemplary embodiment, the polymer material may include polyethersulphone ("PES"), polyacrylate ("PA"), polyarylate ("PAR"), polyetherimide ("PEI"), polyethylenenapthalate ("PEN"), polyethyleneterepthalate ("PET"), polyphenylenesulfide ("PPS"), polyallylate, polyimide ("PI"), polycarbonate ("PC"), cellulosetriacetate ("CAT"), cellulose acetate propionate ("CAP"), or a combination thereof, for example. In another exemplary embodiment, the first substrate 110 may be a flexible substrate including PI.

A plurality of pixel electrodes 120 may be disposed on the first substrate 110. Although not illustrated in the drawing, a plurality of components may be further disposed between the first substrate 110 and the plurality of pixel electrodes 120. In an exemplary embodiment, the plurality of components may include a buffer layer, a plurality of conductive interconnections, an insulating layer, a plurality of thin film transistors ("TFTs"), and the like. In an exemplary embodiment, in the plurality of TFTs, amorphous silicon, polysilicon, low-temperature polysilicon ("LTPS"), an oxide semiconductor, an organic semiconductor, or the like may be used as a channel layer. Types of channel layers of the plurality of TFTs may be different from each other. In an exemplary embodiment, both of a TFT including an oxide semiconductor and a TFT including LTPS may be included in a single pixel unit in consideration of a role or a process sequence of a TFT.

The plurality of pixel electrodes 120, a pixel definition film 130, and a plurality of OLEDs 140 will be described on the basis of a first pixel electrode 121 and a first OLED 141 with reference to FIGS. 1A and 2.

Figure 2:
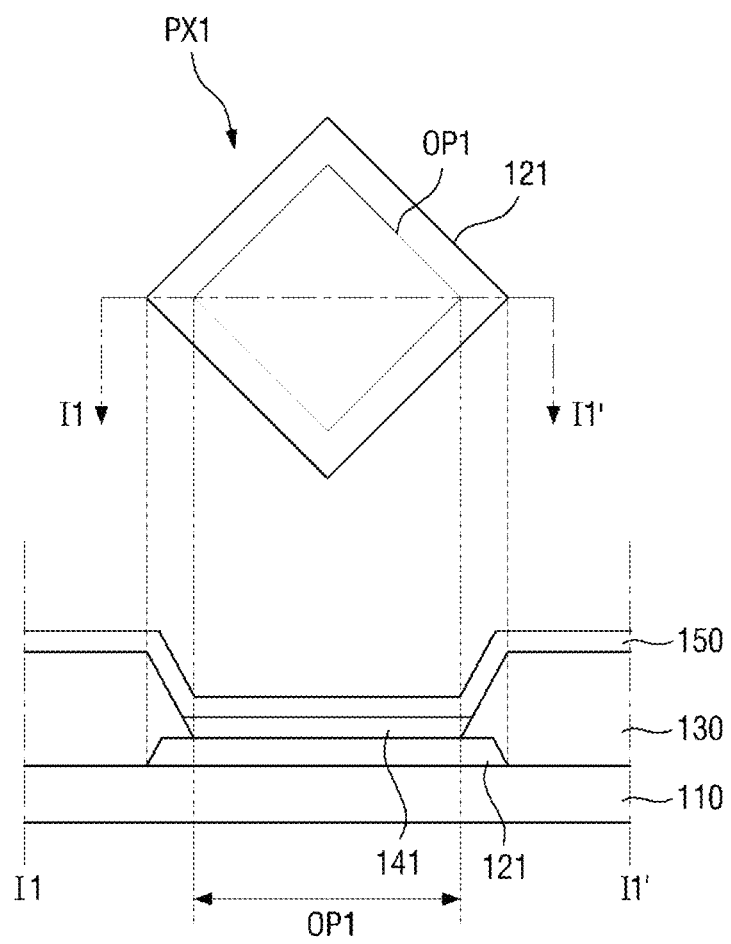
FIG. 2 shows plan and cross-sectional views illustrating a first pixel unit illustrated in FIG. 1.

FIG. 2 shows plan and cross-sectional views illustrating a first pixel unit illustrated in FIG. 1A.

Referring to FIGS. 1A and 2, in an exemplary embodiment, the first pixel electrode 121 may be an anode electrode. When the first pixel electrode 121 is an anode electrode, the first pixel electrode 121 may be provided with a transparent electrode or semitransparent electrode, or include a reflective material such as aluminum, silver, chromium, or an alloy thereof. In an exemplary embodiment, the transparent or translucent electrode may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"), for example. In an exemplary embodiment, the reflective material may include at least one reflective film including silver (Ag), magnesium (Mg), chromium (Cr), gold (Au), platinum (Pt), nickel (Ni), copper (Cu), tungsten (W), and aluminum (Al), for example.

The pixel definition film 130 may be disposed on the first pixel electrode 121. An opening OP1 which exposes at least a portion of the first pixel electrode 121 is defined in the pixel definition film 130. The pixel definition film 130 may include an organic material or an inorganic material. In an exemplary embodiment, the pixel definition film 130 may include a material such as a photoresist, a polyimide resin, an acrylic resin, a silicon compound, a polyacrylic resin, or the like.

In an exemplary embodiment, the first pixel electrode 121 may have a diamond shape. In an exemplary embodiment, the opening OP1 of the pixel definition film 130 may also have a diamond shape. However, the shape of the first pixel electrode 121 and the shape of the opening OP1 of the pixel definition film 130 are not limited to those illustrated in FIG. 1A. That is, the shape of the first pixel electrode 121 and the shape of the opening OP1 of the pixel definition film 130 may vary according to an arrangement structure of a plurality of pixel units.

The plurality of OLEDs 140 may be disposed on the plurality of pixel electrodes 120 and the pixel definition film 130. The plurality of OLEDs 140 will be described on the basis of the first OLED 141. The first OLED 141 may be disposed in a region of the first pixel electrode 121, which is exposed through the opening OP1 of the pixel definition film 130. That is, the first OLED 141 may overlap the opening OP1 of the pixel definition film 130. In an exemplary embodiment, the first OLED 141 may cover at least a portion of the opening OP1 of the pixel definition film 130.

In an exemplary embodiment, the first OLED 141 may emit one of red light, green light, and blue light, for example. In an exemplary embodiment, a wavelength of the red light may range from about 620 nanometers (nm) to about 750 nm, and a wavelength of the green light may range from about 495 nm to about 570 nm, for example. Also, a wavelength of the blue light may range from about 450 nm to about 495 nm, for example. However, the invention is not limited thereto, and the first OLED may emit various other color lights.

In another exemplary embodiment, the first OLED 141 may emit white light, for example. In an exemplary embodiment, when the first OLED 141 may emit white light, the first OLED 141 may have a structure in which a red light-emitting layer, a green light-emitting layer, and a blue light-emitting layer are stacked, for example. The first OLED 141 may further include a separate color filter for displaying red, green, or blue, for example.

Although not illustrated in the drawings, the first OLED 141 may have a multilayer structure including a hole injection layer ("HIL"), a hole transport layer ("HTL"), an electron transport layer ("ETL"), an electron injection layer ("EIL"), and the like, for example.

Referring back to FIG. 1A, a common electrode 150 may be disposed on the first OLED 141 and the pixel definition film 130. In an exemplary embodiment, the common electrode 150 may be disposed on entire surfaces of the first OLED 141 and the pixel definition film 130. In an exemplary embodiment, the common electrode 150 may be a cathode electrode. In an exemplary embodiment, the common electrode 150 may include at least one of Li, Ca, LiF/Ca, LiF/Al, Al, Ag, and Mg, for example. Also, the common electrode 150 may be provided with a metal thin film having a low work function. In an exemplary embodiment, the common electrode 150 may be a transparent or translucent electrode including at least one of ITO, IZO, ZnO, indium oxide ($In_2O_3$), IGO, and AZO.

A first buffer layer 160 may be disposed on the common electrode 150. There are no specific limitations on a material of the first buffer layer 160. In an exemplary embodiment, the first buffer layer 160 may include an inorganic material or an organic material. In an alternative exemplary embodiment, the first buffer layer 160 may have a structure in which at least one of an organic layer and an inorganic layer form a single layer or are stacked in a multilayer, for example. In another exemplary embodiment, the first buffer layer 160 may be an air layer. In another exemplary embodiment, the first buffer layer 160 may be omitted.

Although not illustrated in the drawings, a capping layer may be disposed on the common electrode 150. The capping layer may prevent light incident on the common electrode 150 from being lost by total reflection. In an exemplary embodiment, the capping layer may be provided with an organic film or an inorganic film. In an exemplary embodiment, the first buffer layer 160 may serve as the capping layer.

A first encapsulation layer 170 may be disposed on the first substrate 110 to cover the plurality of OLEDs 140. That is, the plurality of OLEDs 140 may be disposed between the first substrate 110 and the first encapsulation layer 170. The first encapsulation layer 170 may block external oxygen and moisture from the plurality of OLEDs 140.

In an exemplary embodiment, the first encapsulation layer 170 may be a transparent insulating substrate. In an exemplary embodiment, the first encapsulation layer 170 may be a glass substrate, a quartz substrate, a transparent resin substrate, or the like, for example. A sealing member may be disposed between the first encapsulation layer 170 and the first substrate 110 to bond the first encapsulation layer 170 and the first substrate 110.

The diffraction panel 200 may be disposed on the display panel 100. More specifically, the diffraction panel 200 may be disposed on a path of light emitted from the plurality of OLEDs 140 included in the display panel 100.

In an exemplary embodiment, the diffraction panel 200 may be coupled to the display panel 100 through a first adhesive member 310. Here, in an exemplary embodiment, the first adhesive member 310 may be a pressure-sensitive adhesive ("PSA") member. However, the invention is not limited thereto, and in another exemplary embodiment, the first adhesive member 310 may be an optically clear adhesive ("OCA") member. In an alternative exemplary embodiment, the first adhesive member 310 may be an optically clear resin ("OCR") film, for example. When the diffraction panel 200 is directly disposed on the display panel 100 and does not include a base layer, the diffraction panel 200 may be referred to as a diffraction layer. When the diffraction panel 200 is replaced by a diffraction layer, the first adhesive member 310 may be omitted.

The diffraction panel 200 may include a plurality of diffraction patterns 210, a base layer 220, and a protective layer 230.

The plurality of diffraction patterns 210 may be disposed on the base layer 220. That is, the base layer 220 may provide a base surface for the plurality of diffraction patterns 210. There are no specific limitations on a material of the base layer 220. In an exemplary embodiment, the base layer 220 may include an organic material or an inorganic material.

The plurality of diffraction patterns 210 may be provided to protrude in an upward direction (on the basis of FIG. 1) of the base layer 220. Here, the upward direction of the base layer 220 is defined as a direction of the path of the light emitted from the plurality of OLEDs 140.

The plurality of diffraction patterns 210 may diffract light emitted from the display panel 100 to enlarge an effective light emission area. Here, diffraction does not occur only in light provided to the plurality of diffraction patterns 210. That is, the diffraction of the light may be caused by a phenomenon of interference between light provided to the plurality of diffraction patterns 210 and light provided to a region located between each of the plurality of diffraction patterns 210. However, for convenience of description, the patterns which are provided to protrude in the upward direction of the base layer 220 are defined as the plurality of diffraction patterns 210, and a diffraction phenomenon of the light will be described on the basis of the plurality of diffraction patterns 210. A definition of the effective light emission area and an enlargement of the effective light emission area will be described below.

Each of the plurality of diffraction patterns 210 may include first to third refractive layers which are sequentially stacked. The plurality of diffraction patterns 210 will be described on the basis of a first diffraction pattern 211. Here, the first diffraction pattern 211 is arbitrarily selected from the plurality of diffraction patterns 210 to describe the plurality of diffraction patterns 210. A location of the first diffraction pattern 211 in the plurality of diffraction patterns 210 is not limited to that illustrated in FIG. 1A.

Referring to FIG. 1B, the first diffraction pattern 211 may include a first refractive layer 211a, a second refractive layer 211b, and a third refractive layer 211c. In an exemplary embodiment, the first diffraction pattern 211 may have a structure in which the first refractive layer 211a, the second refractive layer 211b, and the third refractive layer 211c are sequentially stacked. That is, the first refractive layer 211a may be directly disposed on the base layer 220, and the second refractive layer 211b may be located between the first refractive layer 211a and the third refractive layer 211c.

A refractive index of the first refractive layer 211a may be determined by a refractive index of the base layer 220 and a refractive index of the second refractive layer 211b. A refractive index of the third refractive layer 211c may be determined by a refractive index of the protective layer 230 and the refractive index of the second refractive layer 211b. A thickness t1 of the first refractive layer 211a may be determined by the refractive index of the first refractive layer 211a. A thickness t3 of the third refractive layer 211c may be determined by the refractive index of the third refractive layer 211c.

More specifically, the refractive index and the thickness t1 of the first refractive layer 211a and the refractive index and the thickness t3 of the third refractive layer 211c may be determined such that reflectance of the first diffraction pattern 211 are sufficiently reduced, and may be determined in consideration of refractive indexes or thicknesses of other components, for example, the second refractive layer 211b, the base layer 220, and the protective layer 230. Here, the reflectance of the first diffraction pattern 211 is defined as a ratio of an amount of light which is reflected by the first diffraction pattern 211 and provided back to the outside when it is assumed that an amount of light incident from the outside (hereinafter, referred to as external light) is 100.

In an alternative exemplary embodiment, first, the refractive index and the thickness t1 of the first refractive layer 211a and the refractive index and the thickness t3 of the third refractive layer 211c may be determined, and accordingly, refractive indexes of the base layer 220 and the protective layer 230 may be determined, for example. However, in consideration of process conditions and a relationship between the diffraction panel 200 and other components, the refractive indexes and the thicknesses t1 and t3 of the first refractive layer 211a and the third refractive layer 211c may be easily determined according to the refractive indexes of the base layer 220 and the protective layer 230.

The refractive indexes and thicknesses t1 to t3 of the first to third refractive layers 211a to 211c may vary according to the reflectance of the first diffraction pattern 211. In other words, the reflectance of the plurality of diffraction patterns 210 including the first diffraction pattern 211 may be controlled by adjusting at least one of the refractive index and the thickness of the diffraction pattern. This will be described below with reference to FIG. 8.

The sum of the thicknesses t1 to t3 of the first to third refractive layer 211a to 211c may be expressed as a first thickness T1, for example. The first thickness T1 is defined as the shortest distance from a lower surface of the first diffraction pattern 211 to an upper surface thereof.

The protective layer 230 may be disposed on the plurality of diffraction patterns 210. In an exemplary embodiment, the protective layer 230 may be provided to cover the plurality of diffraction patterns 210. There are no specific limitations on a material of the protective layer 230. In an exemplary embodiment, the protective layer 230 may be provided with an organic film or an inorganic film. In an exemplary embodiment, the organic film may include at least one of an acrylic resin, a methacrylic resin, a polyisoprene resin, a vinyl resin, an epoxy resin, a urethane resin, a cellulose resin, a siloxane resin, a polyimide resin, a polyamide resin, and a perylene resin, for example. In an exemplary embodiment, the inorganic film may include at least one of aluminum oxide, titanium oxide, silicon oxide, silicon oxynitride, zirconium oxide, and hafnium oxide, for example.

In another exemplary embodiment, the protective layer 230 may include an adhesive material for bonding with a component disposed on the diffraction panel 200. Here, there are no specific limitations on a type of the adhesive material. In an exemplary embodiment, when the protective layer 230 includes an adhesive material, the protective layer 230 may be a PSA layer or an OCA layer. Accordingly, a separate adhesive member may not be disposed between the protective layer 230 and the component which is disposed on the diffraction panel 200.

Next, shapes of the plurality of diffraction patterns 210 will be described with reference to FIGS. 3A and 4.

Figure 3A:
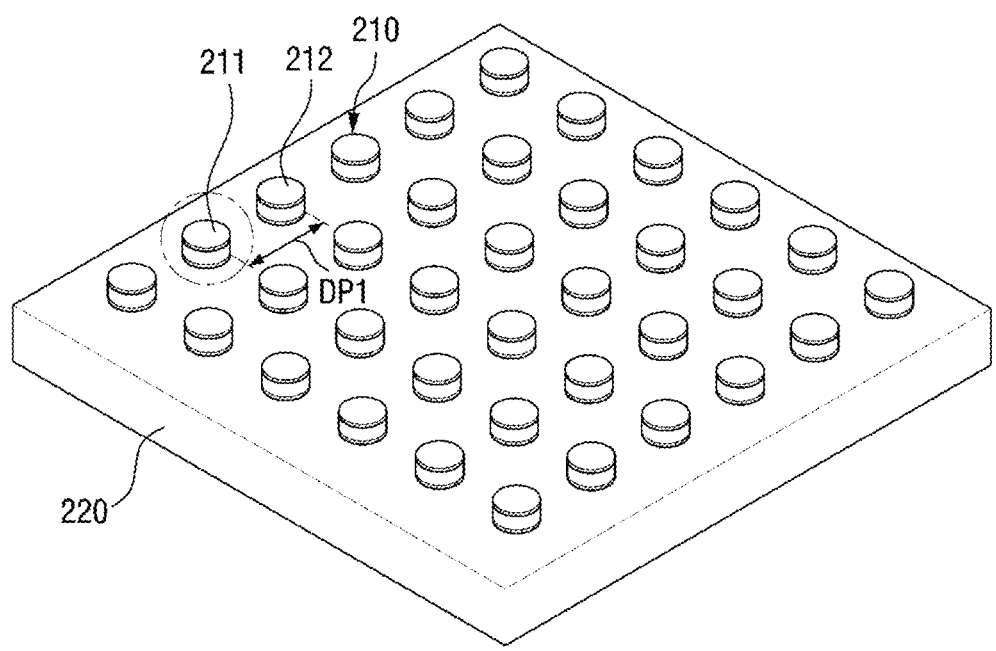
FIG. 3A is a perspective view illustrating a base layer and a plurality of diffraction patterns illustrated in FIG. 1A.
Figure 3B:
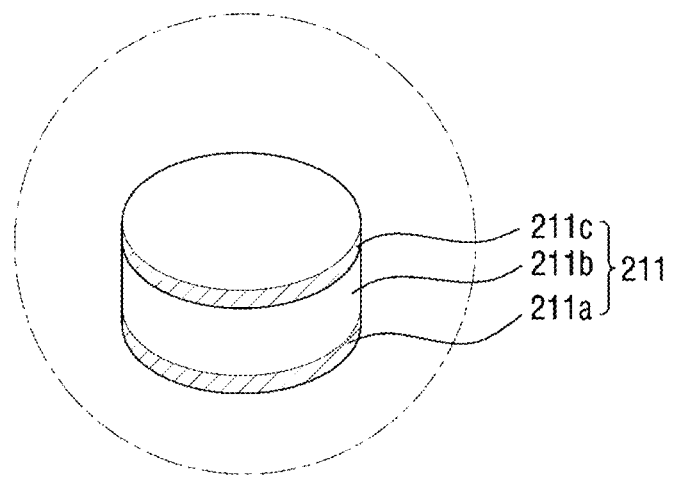
FIG. 3B is an enlarged view of a diffraction pattern.
Figure 5:
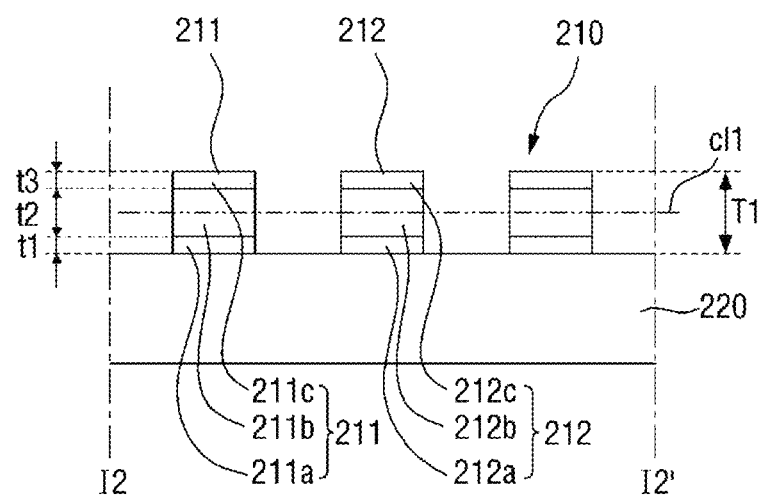
FIG. 5 is a cross-sectional view taken along line 12-12' illustrated in FIG. 4.
Figure 6:
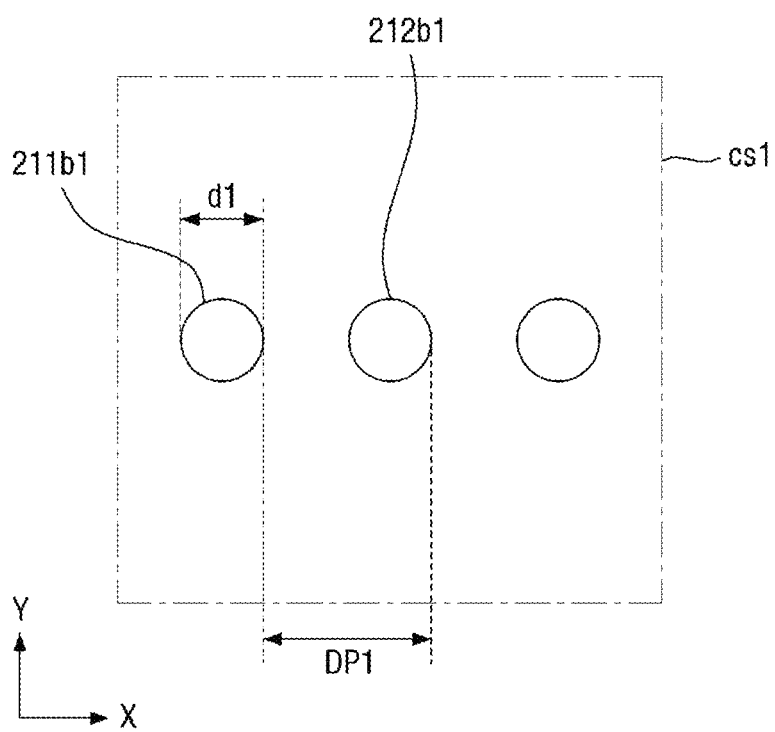
FIG. 6 is a cross-sectional view taken along a first imaginary line illustrated in FIG. 5.

FIG. 3A is a perspective view illustrating the base layer and the plurality of diffraction patterns illustrated in FIG. 1A. FIG. 4 is a plan view illustrating the base layer and the plurality of diffraction patterns illustrated in FIG. 1A. FIG. 5 is a cross-sectional view taken along line 12-12' illustrated in FIG. 4. FIG. 6 is a cross-sectional view taken along a first imaginary line illustrated in FIG. 5. For convenience of description, the protective layer 230 will be omitted in FIGS. 3A to 6.

First, the shapes and the number of the plurality of diffraction patterns 210 will be described.

Figure 4:
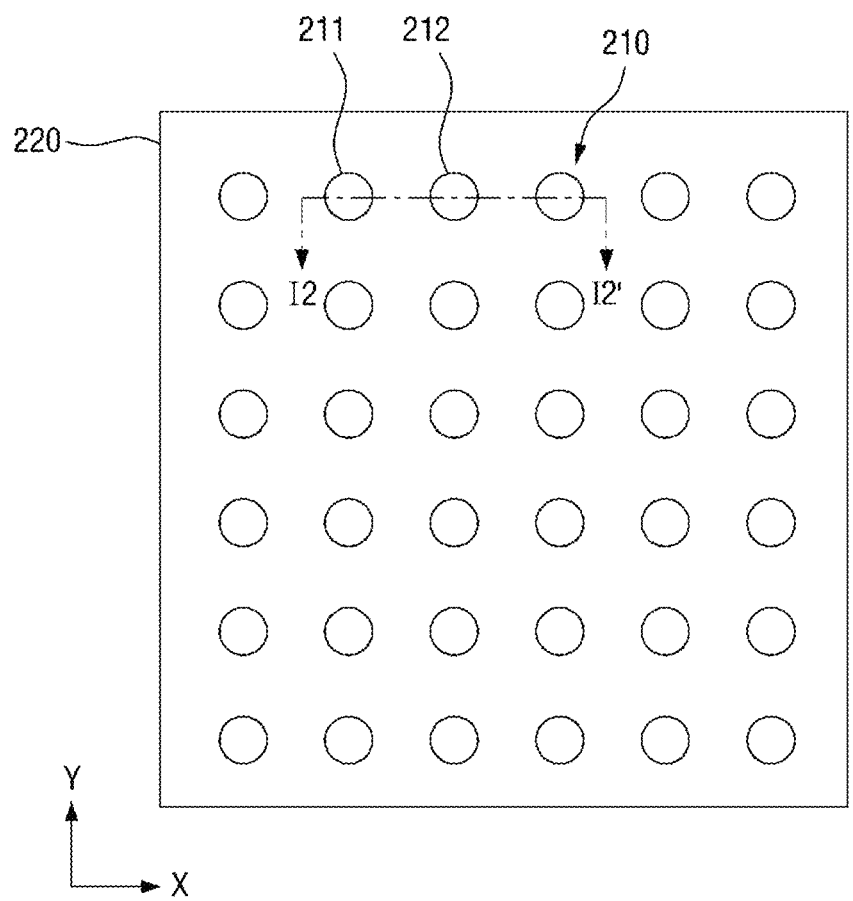
FIG. 4 is a plan view illustrating the base layer and the plurality of diffraction patterns illustrated in FIG. 1.

Referring to FIGS. 3A and 4, in an exemplary embodiment, the plurality of diffraction patterns 210 may have a cylindrical shape. That is, shapes of upper surfaces and lower surfaces of the plurality of diffraction patterns 210 may be a circular shape. Here, the circular shape includes a circular shape and a shape similar to a circle in consideration of process conditions and the like when viewed from the top. In an exemplary embodiment, the shape similar to a circle may include an elliptical shape or a polygonal shape that is substantially similar to a circle, for example. However, the shapes of the plurality of diffraction patterns 210 are not limited to those illustrated in FIG. 3A. Another exemplary embodiment of the shapes of the plurality of diffraction patterns 210 will be described below.

In an exemplary embodiment, the number of diffraction patterns disposed in a first direction X and the number of diffraction patterns disposed in a second direction Y may be the same. However, the invention is not limited thereto, and the numbers of the diffraction patterns disposed in each of the directions may be different.

Next, periodicity of the plurality of diffraction patterns 210 will be described with reference to FIGS. 3A to 6.

The periodicity of the plurality of diffraction patterns 210 will be described on the basis of the first diffraction pattern 211 and the second diffraction pattern 212. Here, the second diffraction pattern 212 may be adjacent to the first diffraction pattern 211 in the first direction X and may include a first refractive layer 212a, a second refractive layer 212b, and a third refractive layer 212c. Here, the first direction X is defined as a row direction with reference to FIG. 3A. The second direction Y is defined as a column direction perpendicular to the first direction X.

The first diffraction pattern 211 and the second diffraction pattern 212 may be disposed to have a first period DP1. Here, the first period DP1 is defined on the basis of a cross section of the diffraction pattern.

The periodicity will be described in more detail. A cross section 211b1 of the first diffraction pattern 211 is defined as a surface taken along a first imaginary line cl1. Here, the first imaginary line cl1 is defined as a line passing through a halfway point of the first thickness T1 of the first diffraction pattern 211. Accordingly, the first imaginary line cl1 passes through the second refractive layer 211b of the first diffraction pattern 211. As a result, the cross section 211b1 of the first diffraction pattern 211 refers to a cross section of the second refractive layer 211b. Similarly, a cross section 212b1 of the second diffraction pattern 212 refers to a cross section of the second refractive layer 212b. That is, the first period DP1 is defined as a distance from one side of the cross section 211b1 of the first diffraction pattern 211 to one side of the cross section 212b1 of the second diffraction pattern 212. In an exemplary embodiment, the first period DP1 may range from about 6.5 micrometers (μm) to about 7.5 μm, for example.

The first diffraction pattern 211 may have a first length d1 in a plane cs1 cut by the first imaginary line cl1. Here, the first length d1 is also defined on the basis of the cross section of the diffraction pattern. That is, the first length d1 refers to a width of the cross section 211b1 of the first diffraction pattern 211. In an exemplary embodiment, the first length d1 may range from about 1.5 μm to about 2.5 μm, for example.

In FIG. 5, the first imaginary line cl1 is illustrated as passing through the second refractive layer 211b of the first diffraction pattern 211, but the invention is not limited thereto. That is, when the thicknesses t1 to t3 of the first to third refractive layer 211a to 211c are changed in consideration of the reflectance of the plurality of diffraction patterns 210 including the first diffraction pattern 211, the first imaginary line cl1 may pass through the first refractive layer 211a or the third refractive layer 211c.

Referring back to FIGS. 3A and 4, a period between the diffraction patterns, which are disposed in the first direction X, among the plurality of diffraction patterns 210 may be the first period DP1. Although not illustrated in the drawings, in an exemplary embodiment, a period between the diffraction patterns disposed in the second direction Y may also be the first period DP1. However, the invention is not limited thereto, and the period between the diffraction patterns disposed in the first direction X and the period between the diffraction patterns disposed in the second direction Y may be different.

Hereinafter, the definition of the effective light emission area and the enlargement of the effective light emission area will be described with reference to FIGS. 7A to 7C.

Figure 7A:
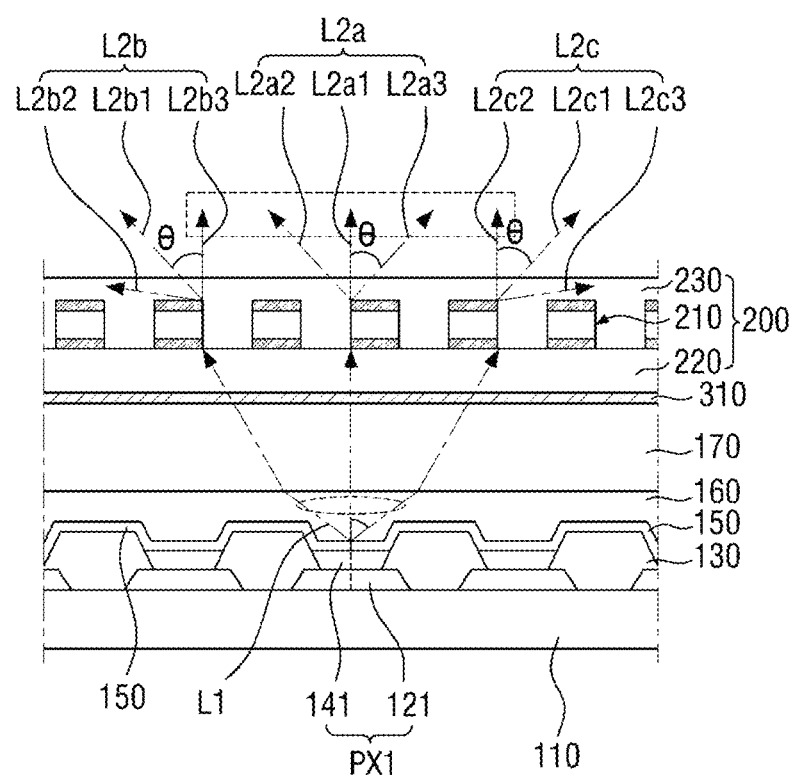
FIGS. 7A to 7C are views for describing an exemplary embodiment of an enlargement of an effective light emission area of the display device according to the invention.
Figure 7B:
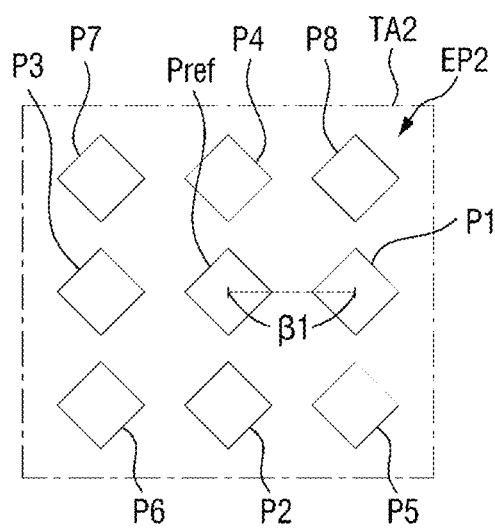
Figure 7C:
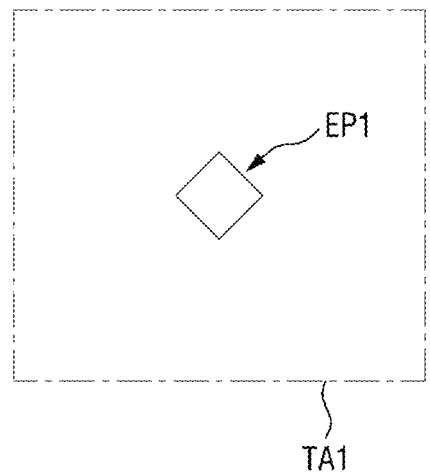

FIGS. 7A to 7C are views for describing the enlargement of the effective light emission area of the display device according to an exemplary embodiment of the invention. For convenience of description, the enlargement of the effective light emission area will be described on the basis of the first pixel electrode 121 and the first OLED 141, which are included in a first pixel unit PX1 described in FIG. 2.

A light emission pattern which is generated in a first region TA1 by light L1 emitted from the first OLED 141 is defined as a first light emission pattern EP1. A light emission pattern which is generated before the light L1 emitted from the first OLED 141 passes through the diffraction panel 200 may also be defined as the first light emission pattern EP1. Also, a light emission pattern which is generated in a second region TA2 by light L2a, light L2b, and light L2c passing through the diffraction panel 200 is defined as a second light emission pattern EP2. Hereinafter, the light L2a, light L2b, and light L2c passing through the diffraction panel 200 are referred to as diffracted light. Here, the first region TA1 and the second region TA2 are assumed to have the same area.

The light L1 emitted from the first OLED 141 may pass through the first encapsulation layer 170 to be provided to the diffraction panel 200. A path of the light L1 emitted from the first OLED 141 may be changed to be a predetermined angle by a phase difference in a refractive index of the first encapsulation layer 170. In this specification, a refractive index of the first buffer layer 160 will be ignored in consideration of relative thicknesses of the first buffer layer 160 and the first encapsulation layer 170. Content of the change of the path of the light due to the refractive index of the first encapsulation layer 170 will be described in a relationship with a first diffraction distance R1 described below.

The diffraction panel 200 may diffract the light L1 emitted from the first OLED 141 to generate first diffracted light L2a, second diffracted light L2b, and third diffracted light L2c. Each of the first diffracted light L2a, the second diffracted light L2b, and the third diffracted L2c may include zero-order diffracted light and first-order diffracted light. Here, the zero-order diffracted light refers to light having the same light path before and after being diffracted by the diffraction panel 200. Also, the first-order diffracted light refers to light having a path changed by the diffraction panel 200 and a diffraction angle θ on the basis of the zero-order diffracted light.

Referring to FIG. 7A, for example, each of reference numerals L2b1, L2a1, and L2c1 is zero-order diffracted light. Also, each of reference numerals L2b2, L2b3, L2a2, L2a3, L2c2, and L2c3 is first-order diffracted light. In another exemplary embodiment, the first diffracted light L2a, the second diffracted light L2b, and the third diffracted L2c may further include second or more order diffracted light. In this specification, examples of the first diffracted light L2a, the second diffracted light L2b, and the third diffracted L2c will be described as including zero-order diffracted light and first-order diffracted light.

The first diffracted light L2a, the second diffracted light L2b, and the third diffracted L2c may include first effective light L2a1, second effective light L2b3, and third effective L2c2 having paths perpendicular to the first substrate 110, respectively. Here, the direction perpendicular to the first substrate 110 may include a direction substantially perpendicular to the first substrate 110 as well as a direction totally perpendicular to the first substrate 110. There are no limitations on the order of the diffracted light as long as effective light has a path perpendicular to the first substrate 110. That is, the effective light may include both zero-order diffracted light and first-order diffracted light as long as the effective light has a path in a vertical direction.

The diffraction panel 200 may diffract the light L1 emitted from the first OLED 141 to generate the first effective light L2a1, the second effective light L2b3, and the third effective light L2c2. A light emission pattern, which is generated in the second region TA2 by the first effective light L2a1, the second effective light L2b3, and the third effective light L2c2, is defined as the second light emission pattern EP2. The second light emission pattern EP2 may include a reference light emission pattern Pref and a plurality of replicated light emission patterns P1 to P8 replicated from the reference light emission pattern Pref. However, luminance of the reference light emission pattern Pref and luminances of the plurality of replicated light emission patterns P1 to P8 may be different.

As described above, an area of the first region TA1 and an area of the second region TA2 are the same. The number of light emission patterns included in the second region TA2 is greater than the number of light emission patterns included in the first region TA1. Accordingly, an area of a light emission region of the second region TA2 is greater than an area of a light emission region of the first region TA1. That is, a region of the second region TA2 in which light is not emitted (i.e., a non-emission region) may be expressed as having a smaller area than that of the first region TA1.

The light emission region having a large area may be expressed as a large light emission area ratio. That is, the light emission area ratio is defined as a ratio of an area of light emission patterns existing in one region to an area of the region. Here, light emission patterns for calculating a light emission area ratio may include all of a reference light emission pattern and replicated light emission patterns. In an exemplary embodiment, the second region TA2 includes nine light emission patterns including the reference light emission pattern Pref and the plurality of replicated light emission patterns P1 to P8 while the first region TA1 includes one light emission pattern, for example. Accordingly, a light emission area ratio of the second region TA2 is greater than a light emission area ratio of the first region TA1.

That is, the diffraction panel 200 may diffract the light L1 emitted from the first OLED 141 to generate a plurality of replicated light emission patterns, and thus the light emission area thereof may be enlarged. Also, since the light emission area is increased, luminous efficiency of the light L1 emitted from the first OLED 141 may be improved.

However, the luminance of the replicated light emission pattern may be used as a factor for calculating the light emission area ratio only when the luminance of the replicated light emission pattern is about 3% or more of the luminance of the reference light emission pattern. Hereinafter, the sum of an area of the reference light emission pattern and areas of the replicated light emission patterns which are replicated from the reference light emission pattern and satisfy about 3% or more of the luminance of the reference light emission pattern in one region is defined as the effective light emission area. Also, a ratio of the effective light emission area to an area in one region is defined as an effective light emission area ratio. In an exemplary embodiment, replicated light emission patterns for calculating the effective light emission area ratio may be limited to patterns having about 3% or more of the luminance of the reference light emission pattern among the replicated light emission patterns, for example. Accordingly, the luminance of the plurality of replicated light emission patterns P1 to P8 may be used as a factor for calculating the effective light emission area ratio when the luminances of the plurality of replicated light emission patterns P1 to P8 are about 3% or more of the luminance of the reference light emission pattern Pref.

The luminance of the reference light emission pattern Pref and the luminances of the plurality of replicated light emission patterns P1 to P8 may be controlled by adjusting the first period DP1 of the plurality of diffraction patterns 210, the first thickness T1 (refer to FIG. 5), and the first length d1 (refer to FIG. 6).

Here, the first thickness T1 is defined as the sum of the thicknesses t1 to t3 of the first to third refractive layers 211a to 211c (refer to FIG. 5). As described above, the thicknesses t1 and t3 of the first and third refractive layers 211a and 211c may be adjusted to sufficiently reduce a reflectance of the diffraction panel 200. Therefore, first, conditions for reducing the reflectance of the diffraction panel 200 will be described with reference to FIG. 8.

Figure 8:
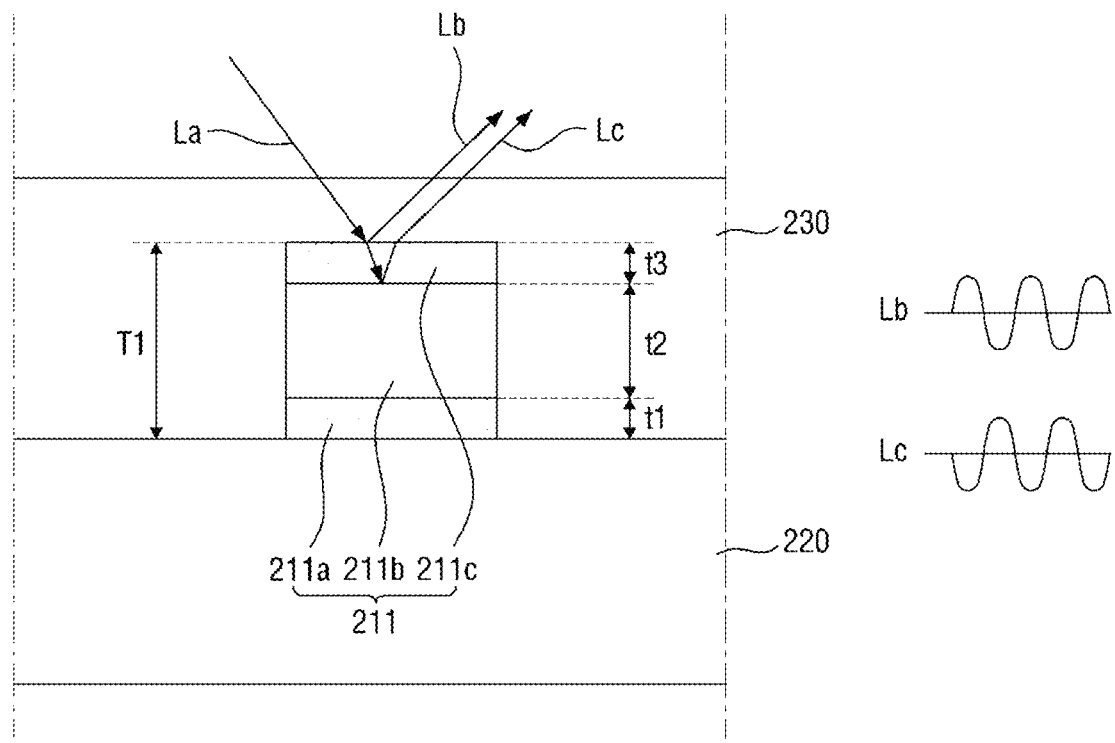
FIG. 8 is a view for describing a reduction of reflectance of light incident on a first diffraction pattern illustrated in FIG. 1.

FIG. 8 is a view for describing a reduction of reflectance of light incident on the first diffraction pattern illustrated in FIG. 1A. In FIG. 8, refraction of light incident on the protective layer 230 will be ignored due to a difference between a refractive index of an external component of the protective layer 230 and the refractive index of the protective layer 230.

First, a refractive index of each of the components will be described.

The refractive index of the first refractive layer 211a and the refractive index of the third refractive layer 211c are lower than the refractive index of the second refractive layer 211b. There are no specific limitations on values of the refractive indexes of the first refractive layer 211a and the third refractive layer 211c as long as the refractive index of the first refractive layer 211a and the refractive index of the third refractive layer 211c are lower than the refractive index of the second refractive layer 211b. In an alternative exemplary embodiment, the refractive indexes of the first refractive layer 211a and the third refractive layer 211c may be the same as or different from each other as long as the refractive index of the first refractive layer 211a and the refractive index of the third refractive layer 211c are lower than the refractive index of the second refractive layer 211b, for example. In an exemplary embodiment, the refractive indexes of the first refractive layer 211a and the third refractive layer 211c may be about 1.71, for example. In an exemplary embodiment, the refractive index of the second refractive layer 211b may be about 1.95, for example.

There are no specific limitations on materials of the first refractive layer 211a, the second refractive layer 211b, and the third refractive layer 211c as long as the refractive index of the first refractive layer 211a and the refractive index of the third refractive layer 211c are lower than the refractive index of the second refractive layer 211b. In an exemplary embodiment, the materials of the first refractive layer 211a and the third refractive layer 211c may be silicon oxynitride (SiON), for example. Also, in an exemplary embodiment, the material of the second refractive layer 211b may be silicon nitride (SiN$_x$), for example.

The refractive indexes of the base layer 220 and the protective layer 230 may be lower than the refractive indexes of the first refractive layer 211a and the third refractive layer 211c. The refractive indexes of the base layer 220 and the protective layer 230 may be determined according to a material capable of performing a function of each component. In an exemplary embodiment, the refractive indexes of the base layer 220 and the protective layer 230 may be the same or different as long as the refractive indexes of the protective layer 230 and the base layer 220 are lower than the refractive indexes of the first refractive layer 211a and the third refractive layer 211c. In an exemplary embodiment, the refractive indexes of the base layer 220 and the protective layer 230 may be about 1.5, for example.

Next, the thicknesses t1 to t3 of the first to third refractive layers 211a to 211c will be described.

In an exemplary embodiment, the thickness t1 of the first refractive layer 211a and the thickness t3 of the third refractive layer 211c may be smaller than the thickness t2 of the second refractive layer 211b. The thickness t1 of the first refractive layer 211a and the thickness t3 of the third refractive layer 211c may be the same or different as long as the thickness t1 of the first refractive layer 211a and the thickness t3 of the third refractive layer 211c are smaller than the thickness t2 of the second refractive layer 211b. In an exemplary embodiment, the thickness t1 of the first refractive layer 211a and the thickness t3 of the third refractive layer 211c may be about 800 angstroms (Å), for example. Also, in an exemplary embodiment, the thickness t2 of the second refractive layer 211b may be about 5,500 Å, for example.

Hereinafter, a reflection reducing effect of the first diffraction pattern 211 will be described in consideration of the refractive indexes and the thicknesses of the first to third refractive layers 211a to 211c.

As described above, the thicknesses t1, t2, and t3 and the refractive indexes of the first refractive layer 211a, the second refractive layer 211b, and the third refractive layer 211c may be adjusted to sufficiently reduce reflectance. More specifically, the thicknesses t1, t2, and t3 and the refractive indexes of the first refractive layer 211a, the second refractive layer 211b, and the third refractive layer 211c may affect a length of a path of light incident on the third refractive layer 211c (hereinafter, referred to as an incident light La) to change a phase of the light. When phases of reflected beams of light are different from each other, an attenuation effect due to overlapping occurs when the reflected beams of light are combined, and amplitude of the reflected light is reduced. That is, the first diffraction pattern 211 may reduce the reflectance by reducing the amplitude of the reflected light using destructive interference of the light.

As illustrated in FIG. 8, an incident light La, a first reflected light Lb, and a second reflected light Lc will be described as examples.

The incident light La is partially reflected at an interface (an upper surface of the third refractive layer 211c) between the protective layer 230 and the third refractive layer 211c according to a difference between the refractive index of the protective layer 230 and the refractive index of the third refractive layer 211c. The light reflected at the upper surface of the third refractive layer 211c will be referred to as the first reflected light Lb.

A path of light transmitted through the third refractive layer 211c without being reflected by the upper surface of the third refractive layer 211c is refracted by the difference between the refractive index of the protective layer 230 and the refractive index of the third refractive layer 211c. The light with the refracted path is partially reflected at an interface (an upper surface of the second refractive layer 211b) between the third refractive layer 211c and the second refractive layer 211b according to a difference between the refractive index of the third refractive layer 211c and the refractive index of the second refractive layer 211b. The light reflected at the upper surface of the second refractive layer 211b will be referred to as the second reflected light Lc.

Here, a phase of the first reflected light Lb may be different from a phase of the second reflected light Lc. More specifically, the phase of the first reflected light Lb may be symmetrical with the phase of the second reflected light Lc, that is, may have a difference by 180 degrees. Accordingly, when the first reflected light Lb and the second reflected light Lc are recombined at the upper surface of the third refractive layer 211c, the first reflected light Lb and the second reflected light Lc may destructively interfere with each other due to a difference between phases thereof. As a result, the amplitude of the reflected light may be reduced, which means that the reflectance of the first diffraction pattern 211 may be reduced.

That is, the refractive index and the thickness t3 of the third refractive layer 211c may be determined such that a condition for causing the first reflected light Lb and the second reflected light Lc to destructively interfere with each other occurs. In other words, the refractive index and the thickness t3 of the third refractive layer 211c may be determined so that the phase of the first reflected light Lb and the phase of the second reflected light Lc are different from each other by 180 degrees.

In an exemplary embodiment, the refractive index of the third refractive layer 211c may satisfy the following Expression 1.

$$n211c = \sqrt{n230 * n211b}$$ [Expression 1]

Here, n211c denotes the refractive index of the third refractive layer 211c, and n230 denotes the refractive index of the protective layer 230. Further, n211b denotes the refractive index of the second refractive layer 211b.

Further, in an exemplary embodiment, the thickness t3 of the third refractive layer 211c may satisfy the following Expression 2.

$$t3 = \lambda_{La}/(4 * n211c)$$ [Expression 2]

Here, $\lambda_{La}$ denotes a wavelength of the incident light La, and n211c denotes the refractive index of the third refractive layer 211c determined by Expression 1.

The reflection reducing effect may be further improved in comparison to a multilayer structure in which layers having different refractive indexes are stacked. Accordingly, the refractive index and the thickness t1 of the first refractive layer 211a may satisfy Expressions 3 and 4, respectively.

$$n211a = \sqrt{220 * n211b}$$ [Expression 3]

$$t1 = \lambda_{211a}/(4 * n211a)$$ [Expression 4]

In Expressions 3 and 4, n211a denotes the refractive index of the first refractive layer 211a and n220 denotes the refractive index of the base layer 220. Further, $\lambda_{211a}$ denotes a wavelength of light incident on the first refractive layer 211a. When the wavelength of the light incident on the first refractive layer 211a is the same as the wavelength of the incident light La, $\lambda_{211a}$ may be replaced by $\lambda_{La}$.

That is, the display device according to the exemplary embodiment of the invention may adjust the refractive index and the thickness of the refractive layer of each of the plurality of diffraction patterns 210, and thus the amplitude of the light reflected by the plurality of diffraction patterns 210 may be reduced and the reflectance may be reduced through the destructive interference of the light.

The following Table 1 is for describing a degree of reflectance reduction.

TABLE 1

| | Single-layer Structure | Multilayer Structure |
|---|---|---|
| Degree of Increase in Reflectance | 2.35% | 0.02% |

The single-layer structure in Table 1 is a case in which the first refractive layer 211a and the third refractive layer 211c are omitted from the first diffraction pattern 211 (however, the first thickness T1 is the same). Further, the multilayer structure in Table 1 is a case in which the first diffraction pattern 211 includes the first refractive layer 211a and the third refractive layer 211c according to an exemplary embodiment of the invention.

Table 1 illustrates a degree of increase in reflectance when each of the diffraction patterns is included. That is, referring to Table 1, it may be seen that the multilayer structure having the first diffraction pattern 211 including the first refractive layer 211a and the third refractive layer 211c has a lower degree of increase in reflectance than the single-layer structure. It may be seen that this means that the reflectance may be reduced by about 2.33% relative to the single-layer structure.

Figure 9:
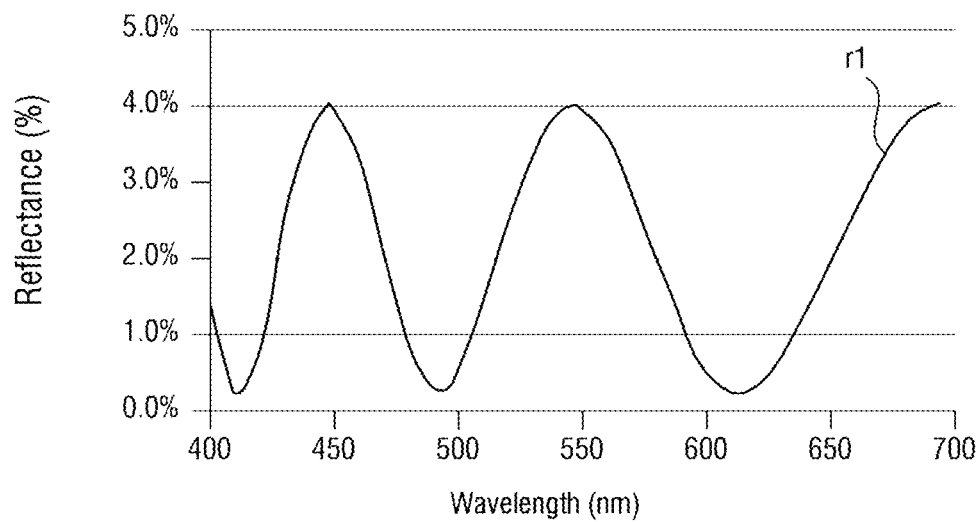
FIG. 9 shows graphs illustrating an exemplary embodiment of reflectance of an organic light-emitting diode ("OLED") display according to the invention.
Figure 9:
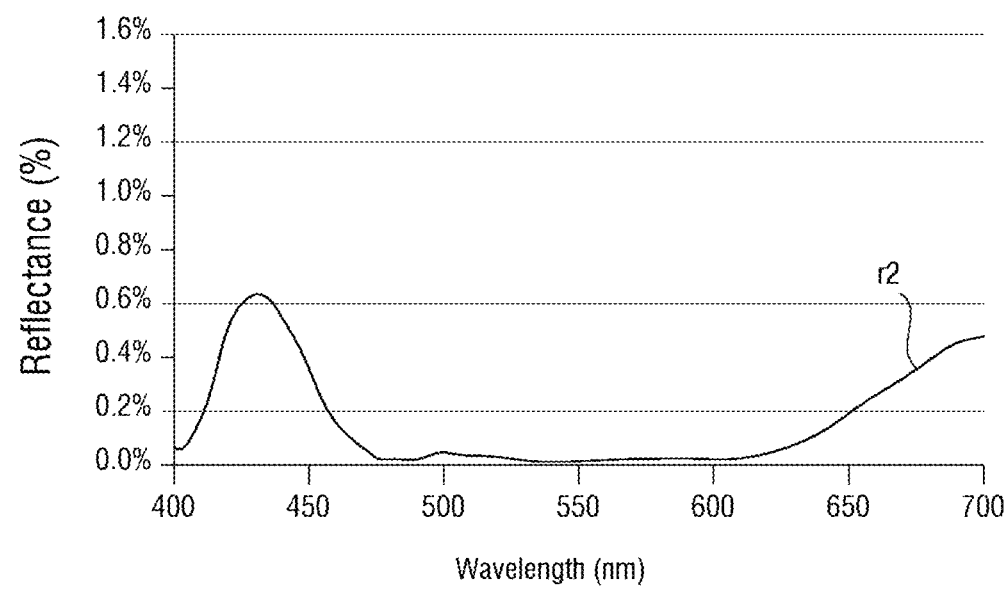

FIG. 9 shows graphs illustrating reflectance of an OLED display according to an exemplary embodiment of the invention. FIG. 9A illustrates reflectance of the single-layer structure of Table 1, and FIG. 9B illustrates reflectance of the multilayer structure of Table 1.

Referring to FIG. 9, reflectance r1 of the single-layer structure is higher than reflectance r2 of the multilayer structure. Specifically, it may be seen that the reflectance r2 of the multilayer structure is lower than the reflectance r1 of the single-layer structure in a wavelength range (about 450 nm to about 750 nm) of the light emitted from the plurality of OLEDs 140 (refer to FIG. 1A).

Next, factors for satisfying about 3% or more of the luminance of the reference light emission pattern Pref with the luminance of at least one of the plurality of above-described replicated light emission patterns P1 to P8 will be described with reference to FIGS. 10(a) to 11(c).

Figure 10A:
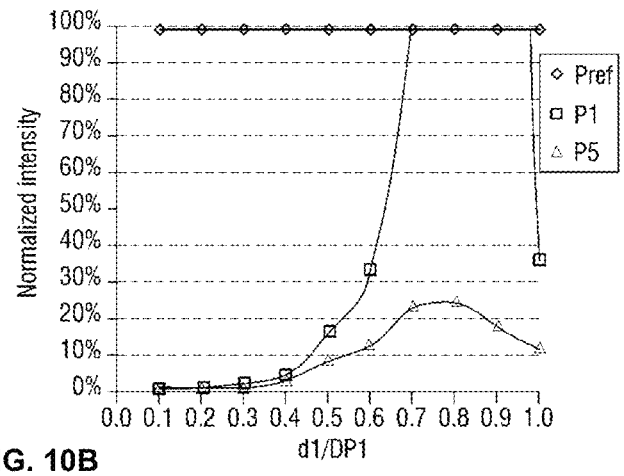
FIGS. 10(a) to 10(c) show graphs illustrating luminance according to a value of d1/DP1 for each light emission color of an OLED.
Figure 10B:
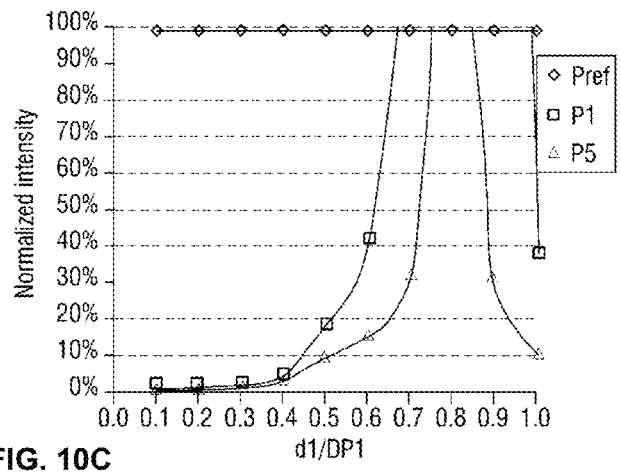
Figure 10C:
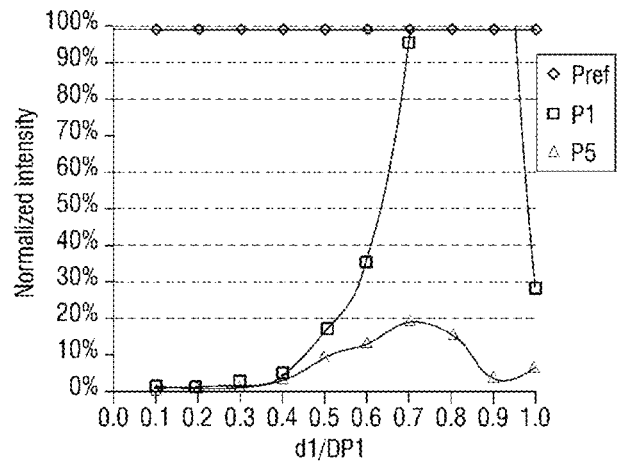
Figure 11A:
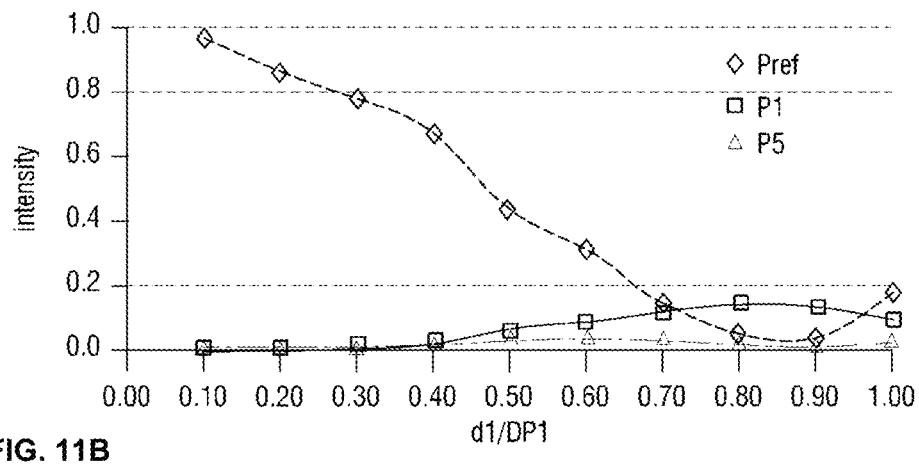
FIGS. 11(a) to 11(c) are graphs obtained by normalizing luminance of a first replicated light emission pattern and luminance of a fifth replicated light emission pattern on the basis of luminance of a reference light emission pattern in FIGS. 10(a) to 10(c)
Figure 11B:
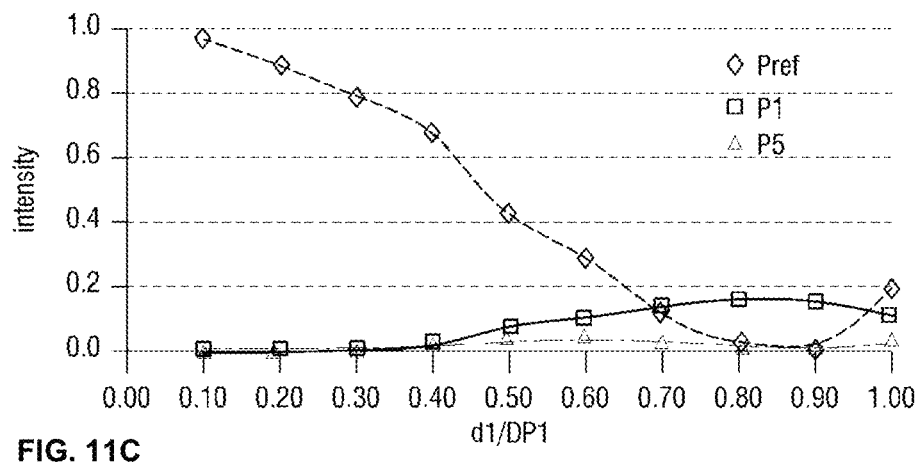
Figure 11C:
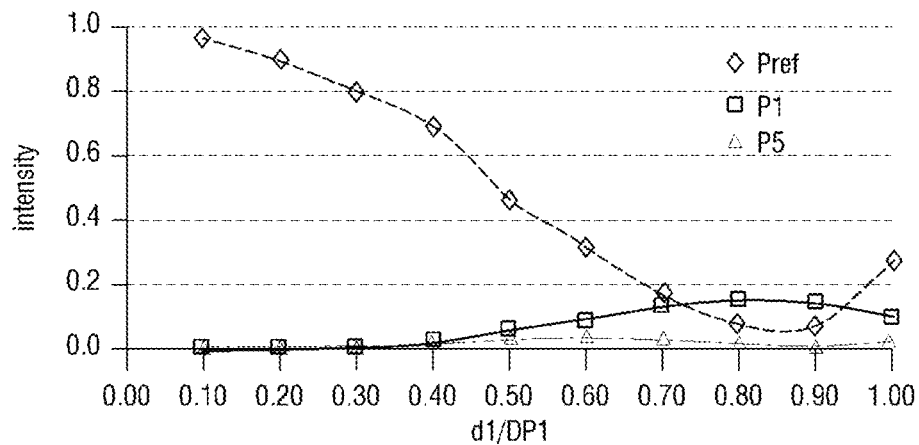

FIG. 10(a) is a graph illustrating luminance according to a value of d1/DP1 when an OLED emits blue light. FIG. 10(b) is a graph illustrating luminance according to a value of d1/DP1 when an OLED emits green light. FIG. 10(c) is a graph illustrating luminance according to a value of d1/DP1 when an OLED emits red light. FIGS. 11(a) to 11(c) are graphs obtained by normalizing luminances of the first replicated light emission pattern P1 and the fifth replicated light emission pattern P5 on the basis of the luminance of the reference light emission pattern Pref, which are respectively illustrated in FIGS. 10(a) to 10(c). Intensity in each of FIGS. 10(a) to 11(c) refers to intensity of the luminance.

The first diffraction pattern 211 will be mainly described with reference to FIGS. 6, 7, 10, and 11. The luminance of the reference light emission pattern Pref and the luminances of the plurality of replicated light emission patterns P1 to P8 may be determined by the first period DP1, the first length d1, the first thickness T1, the refractive indexes of the first to third refractive layers 211a to 211c of the first diffraction pattern 211, and the refractive index of the protective layer 230.

Here, when a relationship between the first period DP1 and the first length d1 satisfies Expression 5, which will be described below, and a relationship between the first thickness T1, the refractive indexes of the first to third refractive layers 211a to 211c of the first diffraction pattern 211, and the refractive index of the protective layer 230 satisfies Expression 6, which will be described below, the luminance of at least one light emission pattern of the plurality of replicated light emission patterns P1 to P8 may be about 3% or more of the luminance of the reference light emission pattern Pref.

In an exemplary embodiment, the first to fourth replicated light emission patterns P1, P2, P3, and P4, which are disposed in the same row or column as the reference light emission pattern Pref, among the plurality of replicated light emission patterns P1 to P8 may have the same luminance. Also, in an exemplary embodiment, the fifth to eighth replicated light emission patterns P5, P6, P7, and P8, which are disposed in a diagonal direction to the reference light emission pattern Pref, among the plurality of replicated light emission patterns P1 to P8 may have the same luminance. However, in an exemplary embodiment, the first to fourth replicated light emission patterns P1, P2, P3, and P4 and the fifth to eighth replicated light emission patterns P5, P6, P7, and P8 may have different luminances. Hereinafter, the reference light emission pattern Pref, the first replicated light emission pattern P1, and the fifth replicated light emission pattern P5 will be mainly described.

First, the relationship between the first period DP1 and the first length d1 will be described with reference to Expression 5. The first period DP1 and the first length d1 should satisfy the following Expression 5.

$$0.4 \leq d1/DP1 \leq 1 \quad \text{[Expression 5]}$$

Referring to FIGS. 10(a) to 11(c), it may be seen that when the value of d1/DP1 increases, the luminance of the reference light emission pattern Pref substantially decreases and the luminances of the first replicated light emission pattern P1 and the fifth replicated light emission pattern P5 substantially increase.

Also, referring to FIGS. 11(a) to 11(c) in which the luminances are normalized on the basis of the reference light emission pattern Pref, it may be seen that the luminance of the first replicated light emission pattern P1 is about 3% or more of the luminance of the reference light emission pattern Pref when the value of d1/DP1 is about 0.4 or more, for example. When the value of d1/DP1 ranges from about 0.7 to about 0.9, the luminance of the first replicated light emission pattern P1 may be higher than the luminance of the reference light emission pattern Pref.

The case in which the value of d1/DP1 is 1 indicates that the first period DP1 and the first length d1 are equal. However, since a cross section of the first diffraction pattern 211 has circular shape, the cross section of the first diffraction pattern 211 has a region which is not in contact with a cross section of an adjacent diffraction pattern even when the first period DP1 and the first length d1 are equal. Therefore, the value of d1/DP1 may include 1.

Next, the relationship between the first thickness T1 of the first diffraction pattern 211, the refractive indexes of the first to third refractive layers 211a to 211c of the first diffraction pattern 211, and the refractive index of the protective layer 230 will be described with reference to Expression 6. The first thickness T1 of the first diffraction pattern 211, the refractive indexes of the first to third refractive layers 211a to 211c of the first diffraction pattern 211, and the refractive index of the protective layer 230 may satisfy the following Expression 6.

$$(m*\lambda_{L1})-60 \text{ (nm)} \leq A \leq (m*\lambda_{L1})+60 \text{ (nm)}$$

$$U=[\{(n230-n211c) \times t3\}+[\{(n230-n211b) \times t2\}+(n230-n211a) \times t1)]$$

$$A \neq U \quad \text{[Expression 6]}$$

Here, λu denotes a wavelength of the light L1 emitted from the first OLED 141, and n230 denotes the refractive index of the protective layer 230. Further, units of U and A are nm, and m is an integer equal to or greater than 0.

The above feature will be described in more detail with reference to FIGS. 6, 7, 12, and 13.

Figure 12A:
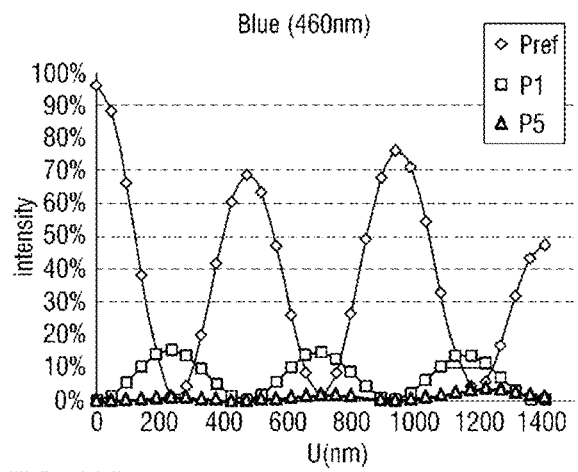
FIGS. 12(a) to (c) shows graphs illustrating luminance according to a value of U for each light emission color.
Figure 12B:
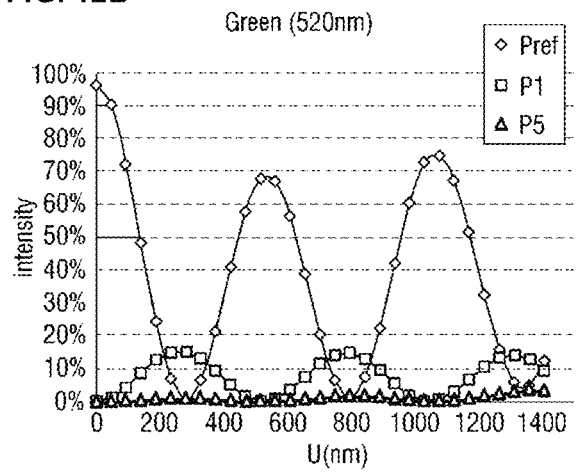
Figure 12C:
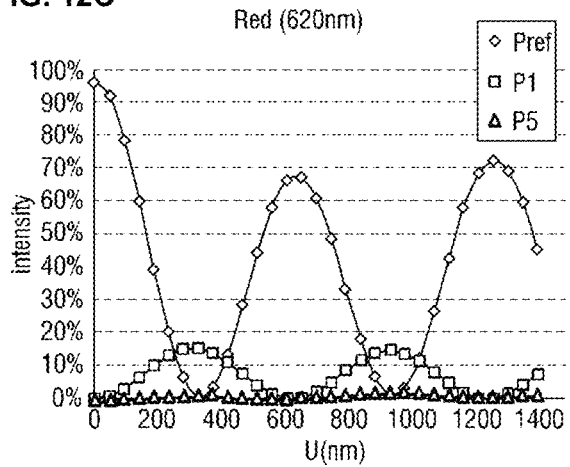
Figure 13A:
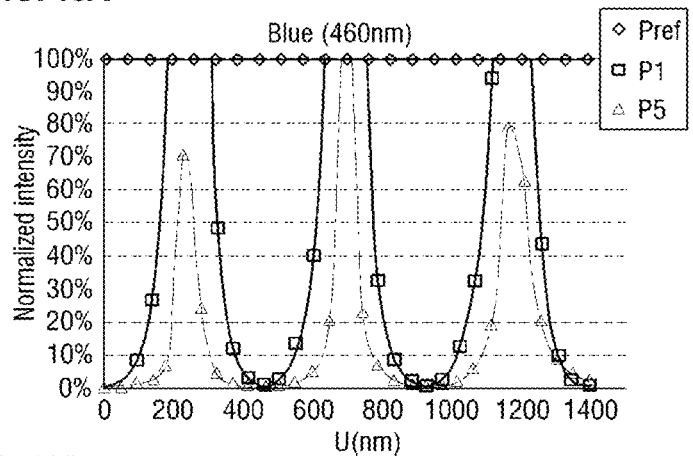
FIGS. 13(a) to 13(c) are graphs obtained by normalizing luminance of a first replicated light emission pattern and luminance of a fifth replicated light emission pattern on the basis of luminance of a reference light emission pattern in FIGS. 12(a) to 12(c)
Figure 13B:
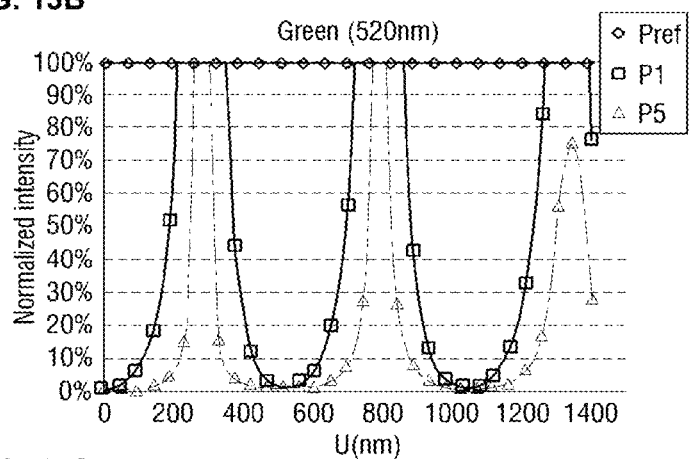
Figure 13C:
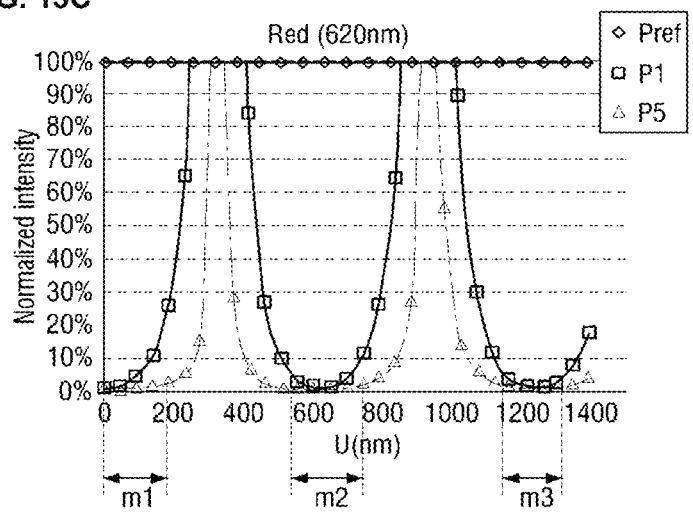

FIG. 12(a) is a graph illustrating luminance according to a value of U when an OLED emits blue light. FIG. 12(b) is a graph illustrating luminance according to a value of U when an OLED emits green light. FIG. 12(c) is a graph illustrating luminance according to a value of U when an OLED emits red light. FIGS. 13(a) to 13(c) are graphs obtained by normalizing the luminances of the first replicated light emission pattern P1 and the fifth replicated light emission pattern P5 on the basis of the luminance of the reference light emission pattern Pref, which are illustrated in FIGS. 12(a) to 12(c).

Referring to FIGS. 12(a) to 12(c), the reference light emission pattern Pref is repeatedly increased or decreased as the value of U is increased. The luminance of the reference light emission pattern Pref according to the value of U may have a substantially sinusoidal shape on the graph.

Referring to FIGS. 13(a) to 13(c) in which the luminances are normalized on the basis of the reference light emission pattern Pref, the luminances of the first replicated light emission pattern P1 and the fifth replicated light emission pattern P5 are repeatedly increased or decreased as the value of U is increased. That is, the luminances of the first replicated light emission pattern P1 and the fifth replicated light emission pattern P5 according to the value of U may have a substantially sinusoidal shape on the graph.

Hereinafter, a description will be given with reference to FIG. 13(c). Sections m1 to m3 illustrated in FIG. 13(c) are regions in which both of the luminances of the first replicated light emission pattern P1 and the fifth replicated light emission pattern P5 are less than about 3% of the luminance of the reference light emission pattern Pref. That is, the sections m1 to m3 are included in a range of A of Expression 6. Therefore, a range of the value of U corresponds to the remaining range except the range of A of Expression 6. In an exemplary embodiment, the section m2 of FIG. 13(c) is a section illustrating a range of a value of A when (m=1), for example. Since $\lambda_{L1}$ is 620 nm in FIG. 13(c), when $\lambda_{L1}$ is applied to Expression 6, the above values may be expressed as follows.

(1*620 nm)−60 (nm)≤A≤(1*620 nm)+60 (nm)=>560 nm≤A≤680 nm

Referring to FIG. 13(c), it may be seen that both of the luminances of the first replicated light emission pattern P1 and the fifth replicated light emission pattern P5 are less than about 3% of the luminance of the reference light emission pattern Pref in the range of the value of A (560 nm≤A≤680 nm).

Accordingly, when the value of U corresponds to the remaining range except the range of A of Expression 6, at least one of the first replicated light emission pattern P1 and the fifth replicated light emission pattern P5 may satisfy about 3% or more of the luminance of the reference light emission pattern Pref.

As a result, in the plurality of diffraction patterns 210, when the relationship between the first period DP1 and the first length d1 satisfies Expression 5 and the relationship between the first thickness T1 of the first diffraction pattern 211, the refractive indexes of the first to third refractive layers 211a to 211c of the first diffraction pattern 211, and the refractive index of the protective layer 230 satisfies Expression 6, the luminance of at least one light emission pattern of the plurality of replicated light emission patterns P1 to P8 may be about 3% or more of the luminance of the reference light emission pattern Pref.

However, there are no specific limitations on the ranges of the first period DP1 and the first length d1 as long as the relationship between the first period DP1 and the first length d1 satisfies Expression 5. In an exemplary embodiment, the first period DP1 may range from about 3.5 μm to about 20 μm, for example. In this case, the first length d1 may range from about 1.4 μm to about 20 μm, for example.

Also, there are no limitations on the value of U as long as the relationship between the first thickness T1 of the first diffraction pattern 211, the refractive indexes of the first to third refractive layers 211a to 211c of the first diffraction pattern 211, and the refractive index of the protective layer 230 satisfies Expression 6.

Referring to FIG. 10, when the value of d1/DP1 ranges from 0.45 to 1, both of the luminances of the first replicated light emission pattern P1 and the fifth replicated light emission pattern P5 may be about 3% or more of the luminance of the reference light emission pattern Pref. That is, when the value of d1/DP1 satisfies the range of 0.45 to 1 and the value of U satisfies the range of Expression 6, both of the luminances of the first replicated light emission pattern P1 and the fifth replicated light emission pattern P5 may be about 3% or more of the luminance of the reference light emission pattern Pref. This means that all of the luminances of the plurality of replicated light emission patterns P1 to P8 may be about 3% or more of the luminance of the reference light emission pattern Pref.

FIG. 14 shows views for describing an enlargement of an effective light emission area of light emitted from an OLED which emits red light in the display device according to an exemplary embodiment of the invention.

Figure 14A:
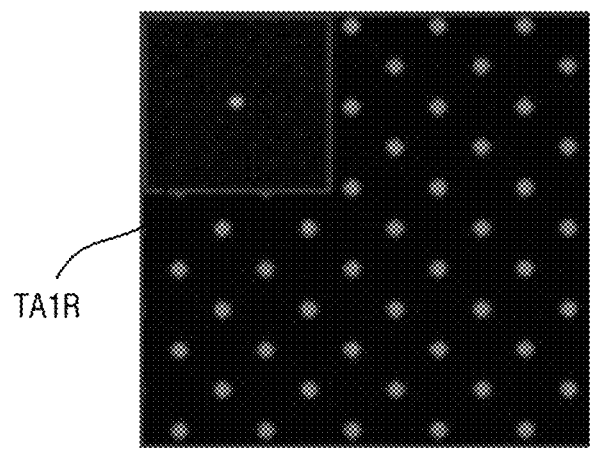
FIGS. 14(a) and 14(b) show views for describing an enlargement of an exemplary embodiment of an effective light emission area of light emitted from an OLED, which emits red light, of the display device according to the invention.
Figure 14B:
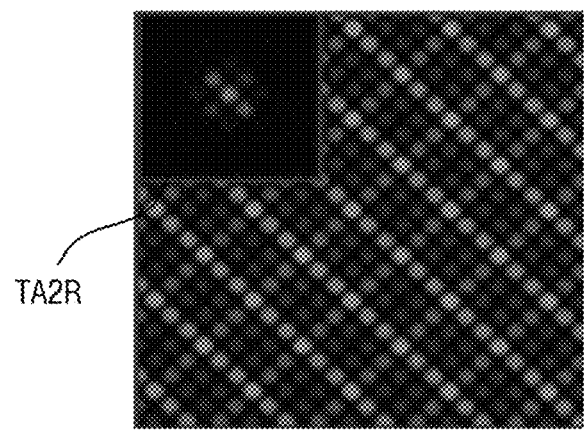

FIG. 14(a) is a view illustrating a plurality of first light emission regions TA1R. FIG. 14(b) is a view illustrating a plurality of second light emission regions TAR2. Here, the first light emission region TA1R is defined as a region in which a light emission pattern generated by an OLED, which emits red light, of the plurality of OLEDs 140 is disposed. Also, the second light emission region TA2R is defined as a region in which light emitted from the OLED which emits red light is diffracted by the diffraction panel 200 so that the generated light emission pattern is disposed.

Referring to FIGS. 14(a) and 14(b), it may be seen that the number of light emission patterns disposed in the first light emission region TA1R is smaller than the number of light emission patterns disposed in the second light emission region TA2R. That is, the diffraction panel 200 may diffract the light emitted from the plurality of OLEDs 140 so that the effective light emission area may be enlarged.

FIG. 15 shows views for describing an enlargement of an effective light emission area of light emitted from an OLED which emits green light in the display device according to an exemplary embodiment of the invention. FIG. 16 shows views for describing enlargement of an effective light emission area of light emitted from an OLED which emits blue light in the display device according to an exemplary embodiment of the invention. However, a description identical to that given in FIG. 14 will be omitted.

Figure 15A:
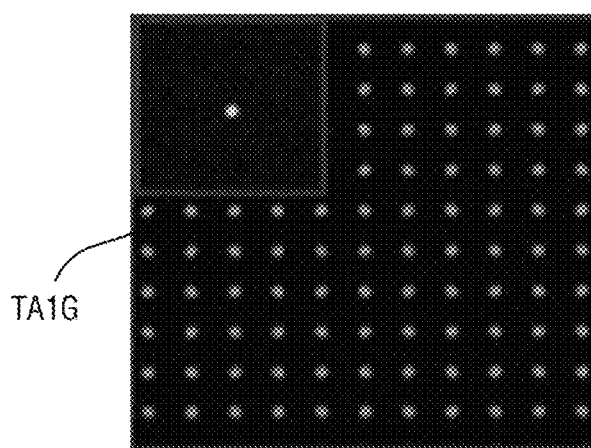
FIGS. 15(a) and 15(b) show views for describing an enlargement of an exemplary embodiment of an effective light emission area of light emitted from an OLED, which emits green light, of the display device according to the invention.
Figure 15B:
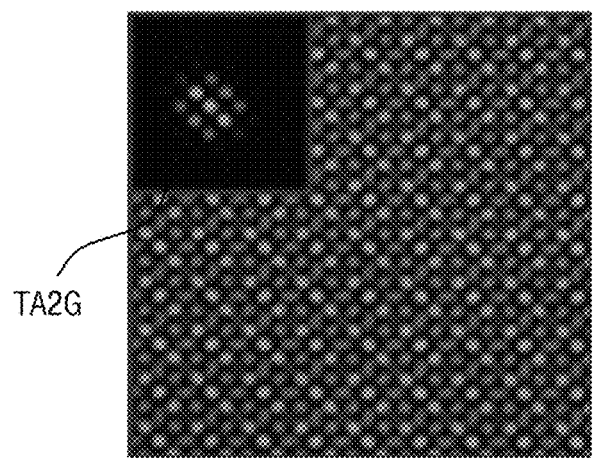
Figure 16A:
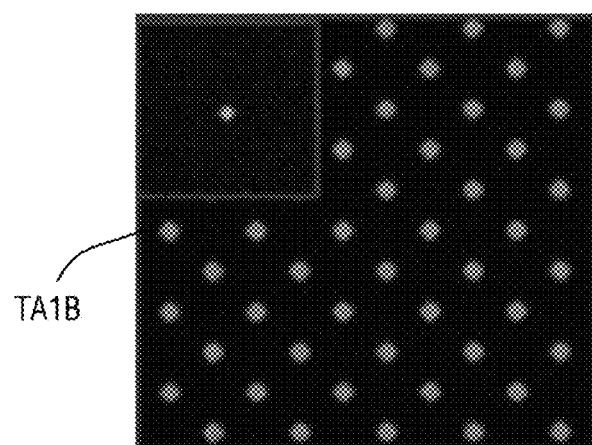
FIGS. 16(a) and 16(b) shows views for describing enlargement of an exemplary embodiment of an effective light emission area of light emitted from an OLED, which emits blue light, of the display device according to the invention.
Figure 16B:
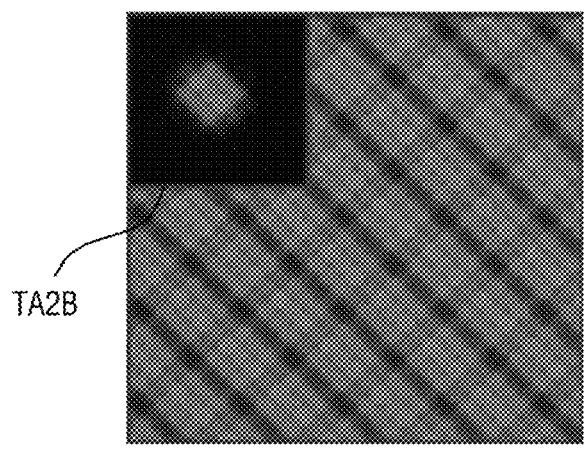

FIG. 15(a) is a view illustrating a plurality of first light emission regions TA1G in which light emission patterns generated by OLEDs which display green are disposed. FIG. 15(b) is a view illustrating a plurality of second light emission regions TA2G in which light emission patterns generated by diffraction of light emitted from OLEDs which display green are disposed. Further, FIG. 16(a) is a view illustrating a plurality of first light emission regions TA1B in which light emission patterns generated by OLEDs which display blue are disposed. FIG. 16(b) is a view illustrating a plurality of second light emission regions TA2B in which light emission patterns generated by diffraction of light emitted from OLEDs which display blue are disposed.

Referring to FIGS. 7A and 14 to 16, the light emitted from the first OLED 141 is diffracted by the diffraction panel 200.

As described above, the effective light emission area is increased by the plurality of replicated light emission patterns P1 to P8 which are replicated and generated from the reference light emission pattern Pref by the diffraction. However, referring to FIGS. 14(b), 15(b), and 16(b), distances between the light emission patterns are different. As a result, it may be seen that a first diffraction distance β1 defined as the shortest distance between the reference light emission pattern Pref and one of the plurality of replicated light emission patterns P1 to P8 is different for each light emission color.

That is, the first diffraction distance 131 may vary according to the light emission color of the OLED. Also, the first diffraction distance 131 may vary according to a distance Z (refer to FIG. 17) between the diffraction panel 200 and the plurality of OLEDs 140, refractive indexes of components disposed between the diffraction panel 200 and the plurality of OLEDs 140, and the like in addition to the light emission color.

Referring to the following Table 2, the first diffraction distance r31 may affect the above-described effective light emission area ratio. More specifically, it may be seen that the effective light emission area ratio is substantially increased as the first diffraction distance 131 is increased. That is, the effective light emission area ratio may be controlled by adjusting factors that affect the first diffraction distance 131.

TABLE 2

| β1 (μm) | Effective Light Emission Area Ratio (%) | | |
| --- | --- | --- | --- |
| | Red (R) | Green (G) | Blue (B) |
| 0.0 | 5.8 | 6.6 | 6.9 |
| 2.4 | 13.4 | 19.1 | 14.8 |
| 4.8 | 19.5 | 32.1 | 27.7 |
| 7.2 | 24.7 | 48.6 | 39.0 |
| 9.6 | 47.8 | 82.6 | 61.1 |
| 12.1 | 74.4 | 93.9 | 83.8 |
| 14.5 | 77.1 | 86.6 | 89.0 |
| 16.9 | 79.5 | 97.9 | 93.8 |
| 19.3 | 89.1 | 85.6 | 96.5 |

Hereinafter, the factors that affect the first diffraction distance 131, which affects the effective light emission area ratio, will be described with reference to FIG. 17.

Figure 17:
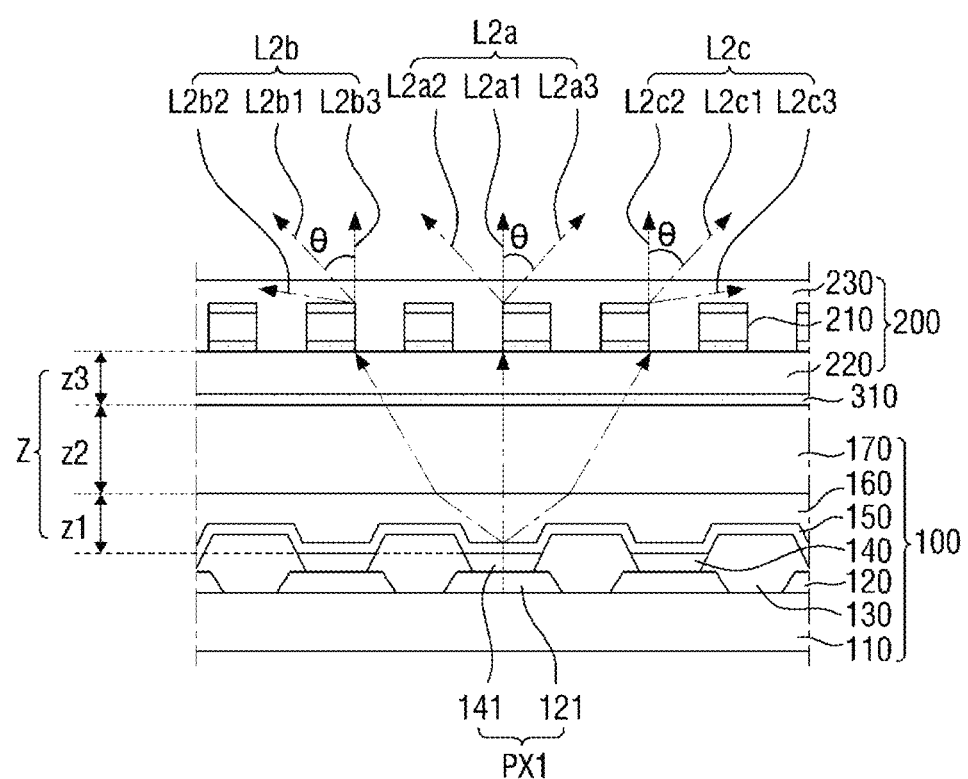
FIG. 17 is a view for describing factors that affect a first diffraction distance.

FIG. 17 is a view for describing the factors that affect the first diffraction distance. However, a description identical to that given in FIG. 7A will be omitted.

Referring to FIG. 17, the first diffraction distance β1 may be determined by the light emission color of the first OLED 141, the distance Z between the diffraction panel 200 and the plurality of OLEDs 140, the refractive index of the first buffer layer 160, the refractive index of the first encapsulation layer 170, the refractive index of the base layer 220, the first period DP1 (refer to FIG. 6) of the plurality of diffraction patterns 210, and the like.

The first diffraction distance β1 may be expressed by the following Expression 7. However, refractive indexes of the first adhesive member 310 and the common electrode 150, which have a relatively small thickness, will be ignored.

$$\beta 1 = z1 \cdot \tan\left[\sin^{-1}\left(\frac{\lambda 141}{DP1} \cdot \frac{1}{n160}\right)\right] +$$

$$z2 \cdot \tan\left[\sin^{-1}\left(\frac{\lambda 141}{DP1} \cdot \frac{1}{n170}\right)\right] +$$

[Expression 7]

$$z3 \cdot \tan\left[\sin^{-1}\left(\frac{\lambda 141}{DP1} \cdot \frac{1}{n220}\right)\right]$$

Here, λ141 denotes a wavelength of the light emission color of the first OLED 141. z1 denotes the shortest distance between the first OLED 141 and the first encapsulation layer 170, and z2 denotes the shortest distance between a lower surface of the first encapsulation layer 170 and the base layer 220. Further, z3 denotes the shortest distance between a lower surface of the base layer 220 and the plurality of diffraction patterns 210. When the first buffer layer 160 is replaced by an air layer, n160 in Expression 7 may be replaced by a refractive index (about 1) of the air layer.

That is, the first diffraction distance β1 may be controlled by adjusting the light emission color of the first OLED 141, the distance Z between the diffraction panel 200 and the plurality of OLEDs 140, the refractive index of the first buffer layer 160, the refractive index of the first encapsulation layer 170, the refractive index of the base layer 220, and the first period DP1 of the plurality of diffraction patterns 210. The effective light emission area ratio may be increased by adjusting the first diffraction distance 131.

However, when the first diffraction distance 131 is increased, blurring may occur. Blurring refers to an image blurring phenomenon that may be caused by display colors of adjacent pixel units overlapping each other. Therefore, in order to balance between the increase of the effective light emission area ratio and the blurring, it is desired to calculate an appropriate first diffraction distance 131.

Each of the effective light emission area ratio and the blurring may be influenced by a distance between pixels. In an exemplary embodiment, even when two OLED displays in which arrangements of pixels are different have the same diffraction distance, distances between adjacent pixel units may be different because arrangements of the pixel units are different, for example. Accordingly, the two OLED displays may have different effective light emission area ratios and degrees of occurrence of blurring. That is, in order to balance between the effective light emission area ratio and the blurring, it is necessary to consider the distance between adjacent pixels as well as the first diffraction distance β1.

Figure 18:
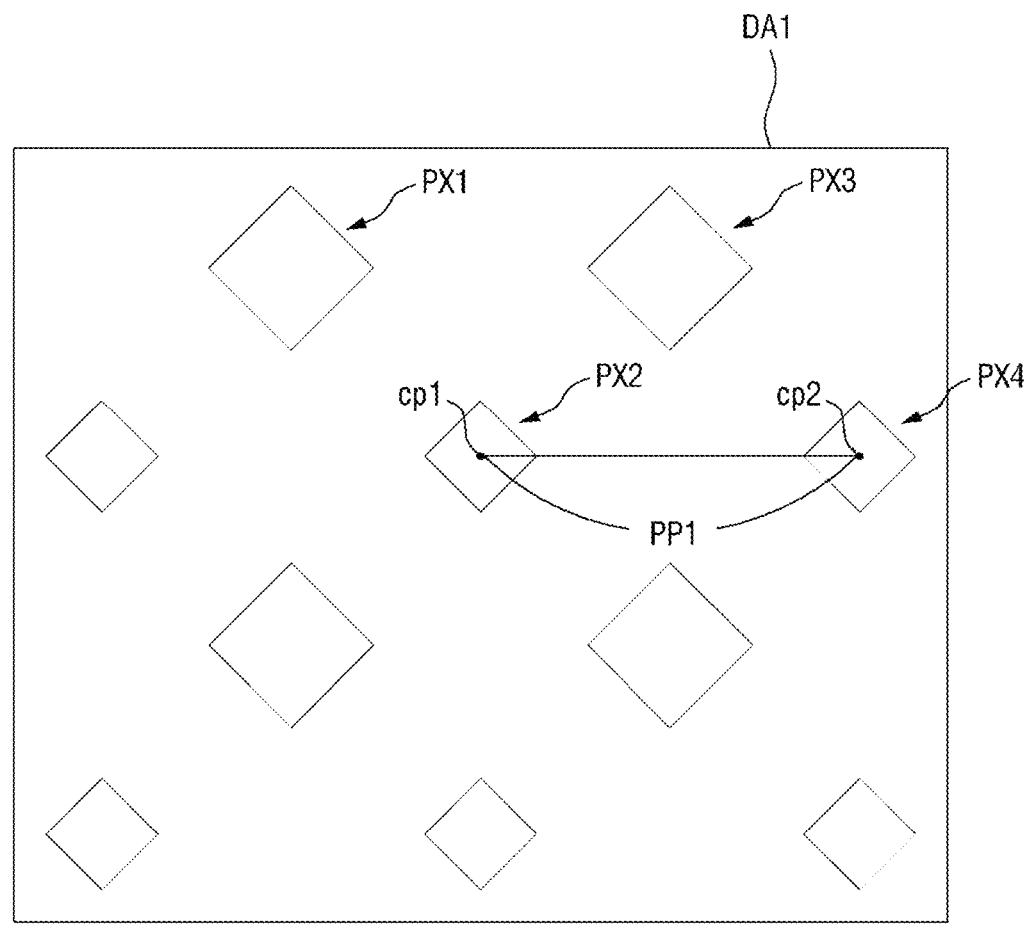
FIG. 18 is a plan view illustrating pixel arrangement of a plurality of pixel units included in a display panel illustrated in FIG. 1.

First, a distance PP1 between pixels will be defined with reference to FIG. 18.

FIG. 18 is a plan view illustrating a pixel arrangement of the plurality of pixel units included in the display panel illustrated in FIG. 1A. Although a first pixel unit PX1 is illustrated for describing the pixel arrangement structure in FIG. 18, the first pixel unit PX1 illustrated in FIG. 2 and the first pixel unit PX1 illustrated in FIG. 18 do not have the same configuration.

An arrangement relationship between first to fourth pixel units PX1 to PX4 will be described with reference to FIG. 18. The first pixel unit PX1 may be disposed to be adjacent to the third pixel unit PX3 in the first direction X. The second pixel unit PX2 may be disposed to be adjacent to the fourth pixel unit PX4 in the first direction X. The first pixel unit PX1 may be disposed to be adjacent to the second pixel unit PX2 in a diagonal direction with respect to the first direction X and the second direction Y. The third pixel unit PX3 may be disposed to be adjacent to the fourth pixel unit PX4 in a diagonal direction with respect to the first direction X and the second direction Y. That is, in an exemplary embodiment, the first to fourth pixel units PX1 to PX4 may be disposed in a parallelogram shape.

In an exemplary embodiment, although all of the first to fourth pixel units PX1 to PX4 are illustrated in a diamond shape, shapes and sizes of the pixel units are not limited to those illustrated in FIG. 18.

In an exemplary embodiment, the first pixel unit PX1 may display red, for example. That is, the first pixel unit PX1 may include a red organic light-emitting layer which emits red light, for example. In an exemplary embodiment, the second and fourth pixel units PX2 and PX4 may display green, for example. That is, each of the second and fourth pixel units PX2 and PX4 may include a green organic light-emitting layer which emits green light, for example. In an exemplary embodiment, the third pixel unit PX3 may display blue, for example. That is, the third pixel unit PX3 may include a blue organic light-emitting layer which emits blue light, for example.

The first to fourth pixel units PX1 to PX4 may constitute one pixel unit. That is, the first to fourth pixel units PX1 to PX4 may be disposed in a pixel region DA1 in an RGBG PenTile manner. However, an arrangement relationship of the plurality of pixel units disposed in the pixel region DA1 is not limited to that illustrated in FIG. 18. In an exemplary embodiment, the arrangement relationship of the plurality of pixel units may vary according to display colors of the pixel units, an applied resolution and aperture ratio of the OLED display, and the like, for example.

Here, the distance PP1 between pixels is defined as a distance between pixel units which display the same color. More specifically, the distance PP1 between pixels is defined as the distance between center points of pixel electrodes each included in the pixel units which display the same color. Hereinafter, the second pixel unit PX2 and the fourth pixel unit PX4 which emit green light will be described as examples.

In an exemplary embodiment, the distance PP1 between pixels may refer to a shortest distance between a first center point cp1 located in the second pixel unit PX2 and a second center point cp2 located in the fourth pixel unit PX4, for example. The first center point cp1 and the second center point cp2 are defined as center points of pixel electrodes included in the second pixel unit PX2 and the fourth pixel unit PX4, respectively.

The relationship between the first diffraction distance $\beta 1$, the distance PP1 between pixels, and the effective light emission area ratio will be described again. The following Table 3 illustrates an effective light emission area ratio according to a value obtained by dividing the first diffraction distance $\beta 1$ by the distance PP1 between pixels.

TABLE 3

| $\beta 1/PP1$ | Effective Light Emission Area Ratio (%) | | |
| --- | --- | --- | --- |
| | Red (R) | Green (G) | Blue (B) |
| 0.00 | 5.8 | 6.6 | 6.9 |
| 0.05 | 13.4 | 19.1 | 14.8 |
| 0.10 | 19.5 | 32.1 | 27.7 |
| 0.15 | 24.7 | 48.6 | 39.0 |
| 0.21 | 47.8 | 82.6 | 61.1 |
| 0.26 | 74.4 | 93.9 | 83.8 |
| 0.31 | 77.1 | 86.6 | 89.0 |
| 0.36 | 79.5 | 97.9 | 93.8 |
| 0.41 | 89.1 | 85.6 | 96.5 |

Referring to Table 3, the effective light emission area ratio may be substantially increased as the value obtained by dividing the first diffraction distance $\beta 1$ by the distance PP1 between pixels is increased.

Next, the relationship between the first diffraction distance $\beta 1$, the distance PP1 between pixels, and blurring will be described with reference to Table 4. The following Table 4 illustrates a blurring recognition score according to the value obtained by dividing the first diffraction distance $\beta 1$ by the distance PP1 between pixels. Here, the blurring recognition score is a result of experimenting with a degree of blurring recognition of the users while changing the value obtained by dividing the first diffraction distance $\beta 1$ by the distance PP1 between pixels, and illustrates an average value of the degrees of blurring recognition of the users. Here, when the visual blurring recognition score is 5 or more, blurring is recognized to an extent which may cause the users to feel discomfort when viewing the screen.

TABLE 4

| $\beta 1/PP1$ | Blurring Recognition Score (Perfect score: 10 points) |
| --- | --- |
| 0.2 | 1.3 |
| 0.45 | 1.2 |
| 0.89 | 2.4 |
| 1.33 | 4.0 |
| 1.89 | 5.1 |
| 2.26 | 6.4 |

Referring to Table 4, when the value obtained by dividing the first diffraction distance $\beta 1$ by the distance PP1 between pixels is about 1.89 or more, the blurring recognition score of the users is 5 or more. This means that when the value obtained by dividing the first diffraction distance $\beta 1$ by the distance PP1 between pixels is greater than about 1.9, most users recognize blurring and feel discomfort.

Therefore, in consideration of Tables 3 and 4, the value obtained by dividing the first diffraction distance $\beta 1$ by the distance PP1 between pixels may satisfy the following Expression 8.

$$0.1 \leq \beta 1/PP1 \leq 1.9 \quad \text{[Expression 8]}$$

That is, the value obtained by dividing the first diffraction distance $\beta 1$ by the distance PP1 between pixels may be set to 0.1 or more and 1.9 or less in order to balance between the effective light emission area ratio and a degree of visual blurring recognition. Accordingly, in the display device according to an exemplary embodiment of the invention, luminous efficiency may be improved by increasing the effective light emission area ratio without causing discomfort due to visual blurring recognition.

There are no specific limitations on a value of each of the first diffraction distance $\beta 1$ and the distance PP1 between pixels as long as the value obtained by dividing the first diffraction distance $\beta 1$ by the distance PP1 between pixels satisfies 0.1 or more and 1.9 or less. In an exemplary embodiment, the first period DP1 and the shortest distance z2 (refer to FIG. 17) between the lower surface of the first encapsulation layer 170 and the base layer 220, which is defined as a thickness of the first encapsulation layer 170, may have values described in the following Table 5.

TABLE 5

| Case | z2 (mm) | DP1 (μm) |
| --- | --- | --- |
| 1 | 0.2 | 0.88-15.3 |
| 2 | 0.3 | 1.24-22.7 |
| 3 | 0.5 | 2-37.4 |

Next, another exemplary embodiment of the plurality of diffraction patterns 210 will be described with reference to FIGS. 19A to 28.

Figure 19A:
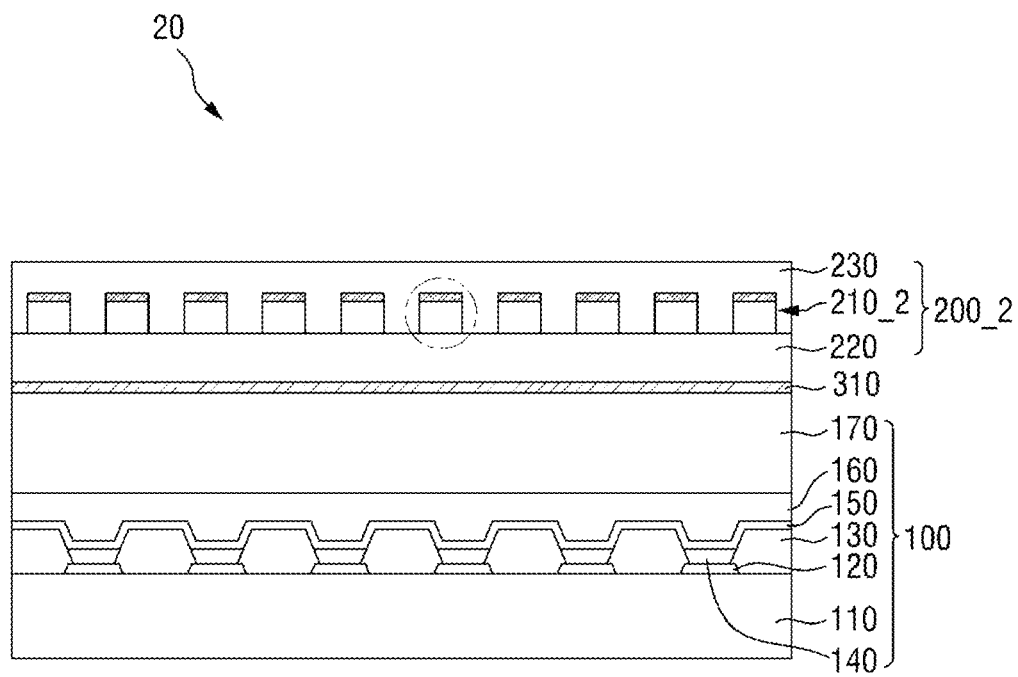
FIG. 19A is a cross-sectional view illustrating another exemplary embodiment of a display device according to the invention.
Figure 19B:
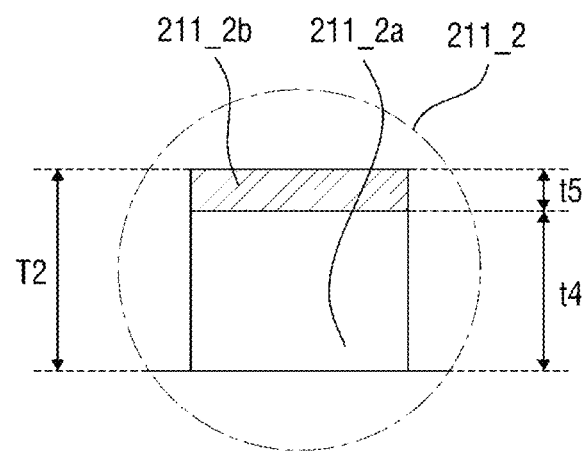
FIG. 19B is an enlarged view of a portion of the display device.

FIG. 19A is a cross-sectional view illustrating a display device according to another exemplary embodiment of the invention, and FIG. 19B is an enlarged view of the display device. However, descriptions identical to those given in FIGS. 1A to 18 will be omitted.

A display device 20 according to another exemplary embodiment of the invention may include a display panel 100 and a diffraction panel 200_2. The display device 20 illustrated in FIG. 19A differs from the display device 10 illustrated in FIG. 1A in that two refractive layers included in each of a plurality of diffraction patterns 210_2 are further included.

The display device 20 will be described in more detail. Referring to FIG. 19A, each of the plurality of diffraction patterns 210_2 may include two refractive layers having different refractive indexes. An example of a first diffraction pattern 211_2 will be described.

Referring to FIG. 19B, a second refractive layer 211_2b may be disposed on the first refractive layer 211_2a. That is, the first diffraction pattern 211_2 may have a structure in which the first refractive layer 211_2a and the second refractive layer 211_2b are sequentially stacked. A refractive index of the first refractive layer 211_2a may be different from a refractive index of the second refractive layer 211_2b. In an exemplary embodiment, the refractive index of the first refractive layer 211_2a may be higher than the refractive index of the second refractive layer 211_2b, for example.

The refractive index of the first refractive layer 211_2a may be determined by the refractive index of the base layer 220. The refractive index of the second refractive layer 211_2b may be determined by the refractive index of the protective layer 230 and the refractive index of the first refractive layer 211_2a. A thickness t4 of the first refractive layer 211_2a may be adjusted by the refractive index of the first refractive layer 211_2a. A thickness t5 of the second refractive layer 211_2b may be adjusted by the refractive index of the second refractive layer 211_2b. In an exemplary embodiment, a second thickness T2 may be the same as the first thickness T1 illustrated in FIG. 1A.

The refractive index and the thickness t4 of the first refractive layer 211_2a and the refractive index and the thickness t5 of the second refractive layer 211_2b may be determined such that reflectance of the first diffraction pattern 211_2 is sufficiently reduced. More specifically, the refractive index and the thickness t4 the first refractive layer 211_2a and the refractive index and the thickness t5 of the second refractive layer 211_2b may be determined such that the reflectance by reducing amplitude of light reflected by the plurality of diffraction patterns 210_2 is sufficiently reduced through the destructive interference phenomenon of the light.

That is, the plurality of diffraction patterns 210_2 included in the display device 20 according to another exemplary embodiment of the invention may include only two layers having different refractive indexes. In this case, in comparison with the display device 10 illustrated in FIG. 1A, the degree to which reflectance is reduced may be reduced, but since the diffraction pattern includes only two layers, ease of the process may be improved and a manufacturing cost thereof may be reduced.

Figure 20:
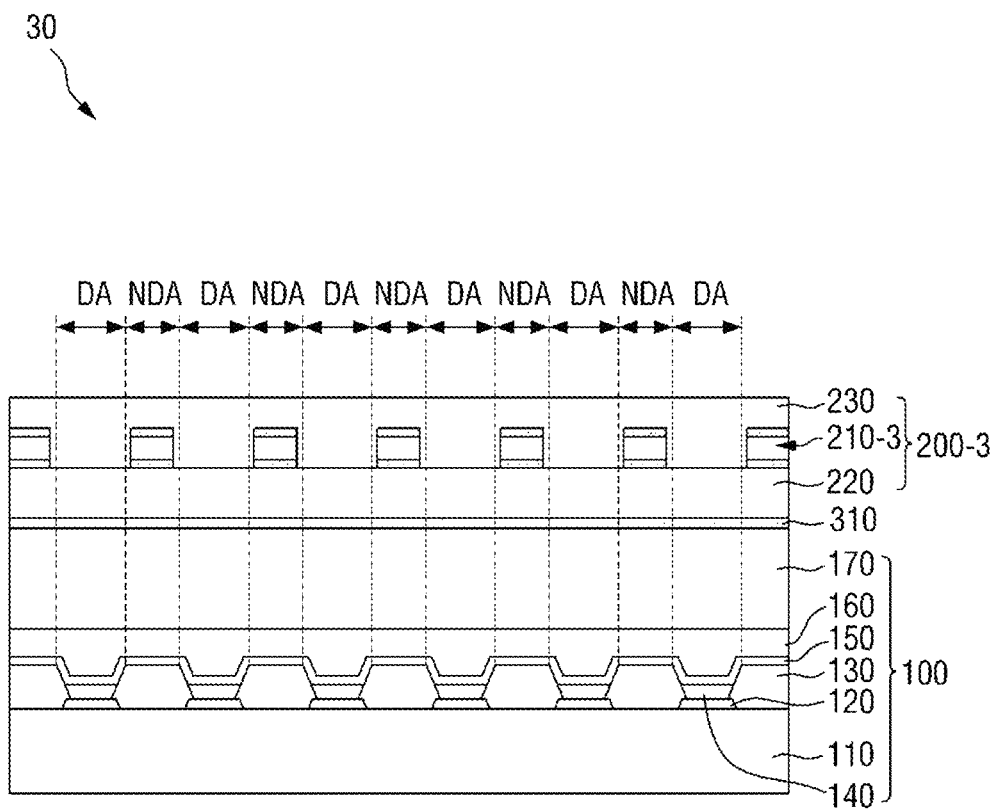
FIG. 20 is a cross-sectional view illustrating still another exemplary embodiment of a display device according to the invention.

FIG. 20 is a cross-sectional view illustrating a display device according to still another exemplary embodiment of the invention. However, descriptions identical to those given in FIGS. 1A to 18 will be omitted.

Referring to FIG. 20, a display device 30 according to still another exemplary embodiment of the invention may include a display panel 100 and a diffraction panel 200_3. The display device 30 illustrated in FIG. 20 differs from the display device 10 illustrated in FIG. 1A in that a plurality of diffraction patterns 210_3 are disposed to overlap only a non-display region NDA. That is, the plurality of diffraction patterns 210_3 is not disposed to overlap a display region DA. Here, the display region DA is defined as a region which overlaps a plurality of OLEDs 140. The non-display region NDA is defined as a region which does not overlap the plurality of OLEDs 140.

Since the plurality of diffraction patterns 210_3 is not disposed in the display region DA, zero-order light emitted from the plurality of OLEDs 140 may pass through the display region DA. The zero-order light may have a relatively higher luminance than first-order light generated by diffraction.

Accordingly, while the zero-order light is used as it is in the display region DA, the non-display region NDA diffracts light through the plurality of diffraction patterns 210_3 to increase the effective light emission area, and thus light efficiency may be improved.

Unlike the illustration in the drawing, all of the plurality of diffraction patterns 210_3 may not be disposed in each of the non-display regions NDA and may be disposed only in a portion of the non-display region NDA.

Figure 21:
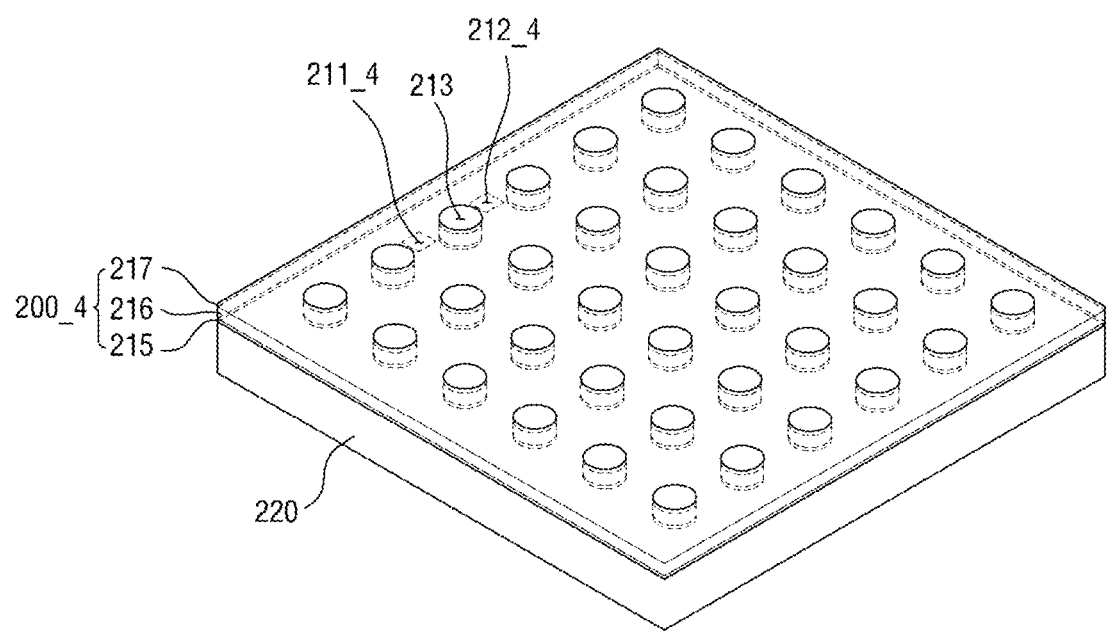
FIGS. 21 to 23 are views for describing another exemplary embodiment of a diffraction panel illustrated in FIG. 1.
Figure 22:
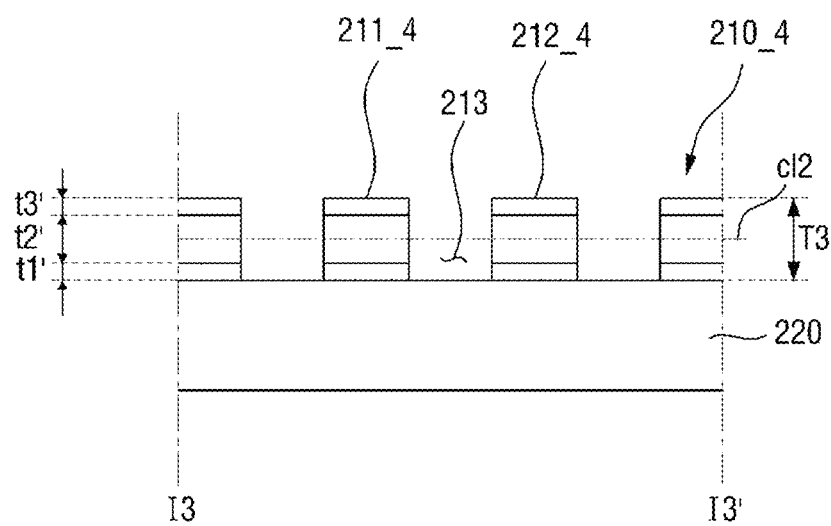
Figure 23:
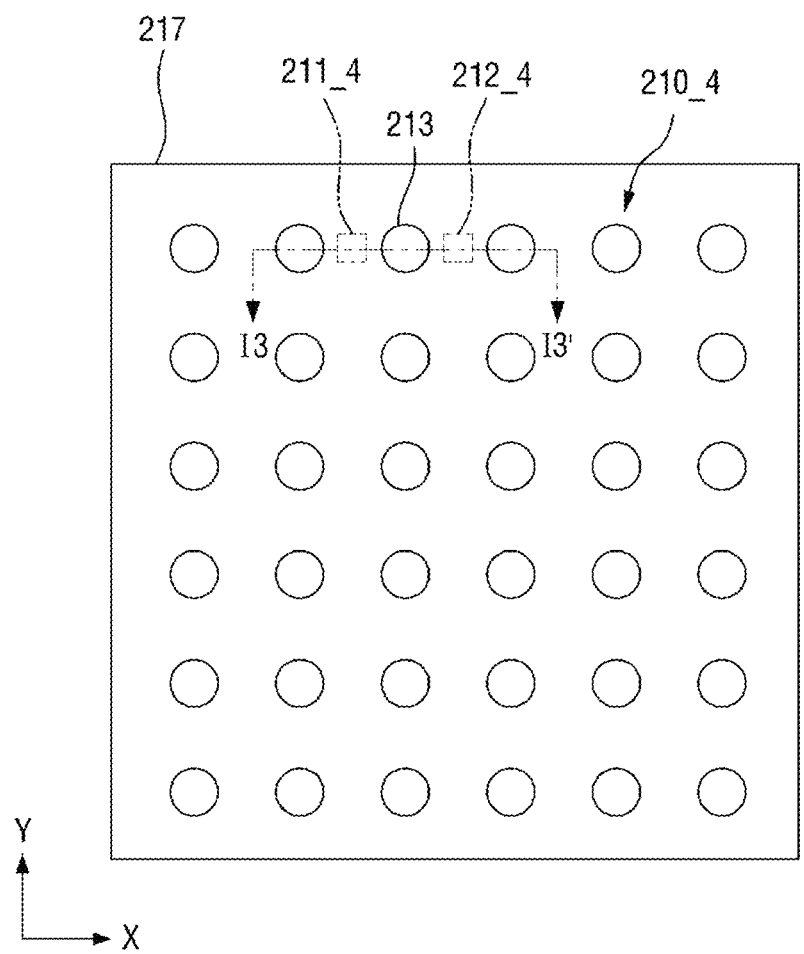

FIGS. 21 to 23 are views for describing another exemplary embodiment of the diffraction panel illustrated in FIG. 1A. In FIGS. 21 to 23, for convenience of description, the protective layer 230 will be omitted.

Referring to FIGS. 21 to 23, a diffraction panel 200_4 may include a plurality of diffraction patterns 210_4. That is, the diffraction panel 200_4 illustrated in FIGS. 21 to 23 differs from the diffraction panel 200 illustrated in FIG. 1A in that a plurality of holes 213 is defined to be recessed.

The plurality of diffraction patterns 210_4 may be provided by sequentially stacking a first refractive layer 215, a second refractive layer 216, and a third refractive layer 217 on the base layer 220. In an exemplary embodiment, a plurality of holes 213 passing through the plurality of diffraction patterns 210_4 may be defined in the plurality of diffraction patterns 210_4.

That is, in an exemplary embodiment, the plurality of diffraction patterns 210_4 is provided by a method of sequentially stacking the first refractive layer 215, the second refractive layer 216, and the third refractive layer 217 on the base layer 220 and then forming the plurality of holes 213. In an exemplary embodiment, the plurality of holes 213 may be defined between a first diffraction pattern 211_4 and a second diffraction pattern 212_4 adjacent to each other.

The plurality of diffraction patterns 210_4 may have a third thickness T3. The third thickness T3 is defined as the sum of a thickness t1' of the first refractive layer 215, a thickness t2' of the second refractive layer 216, and a thickness t3' of the third refractive layer 217. A period and lengths of the plurality of diffraction patterns 210_4 are also defined on the basis of cross sections taken along a second imaginary line cl2. Since the period and lengths of the diffraction patterns are identical to those given in FIG. 6, descriptions thereof will be omitted.

Next, another exemplary embodiment of a shape of each of the plurality of diffraction patterns 210 illustrated in FIG. 1A will be described.

FIGS. 24A to 27 are cross-sectional views illustrating another exemplary embodiment of the plurality of diffraction patterns illustrated in FIG. 1A. Descriptions identical to those given in FIGS. 1A to 23 will be omitted.

Figure 24A:
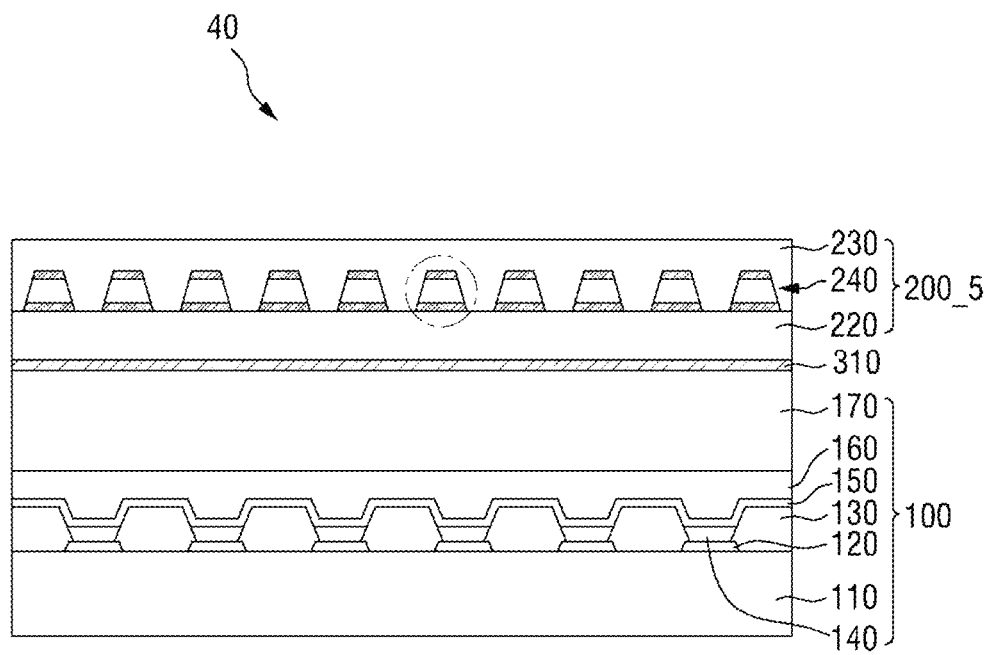
FIGS. 24A to 27 are cross-sectional views illustrating another exemplary embodiment of the plurality of diffraction patterns illustrated in FIG. 1.
Figure 24B:
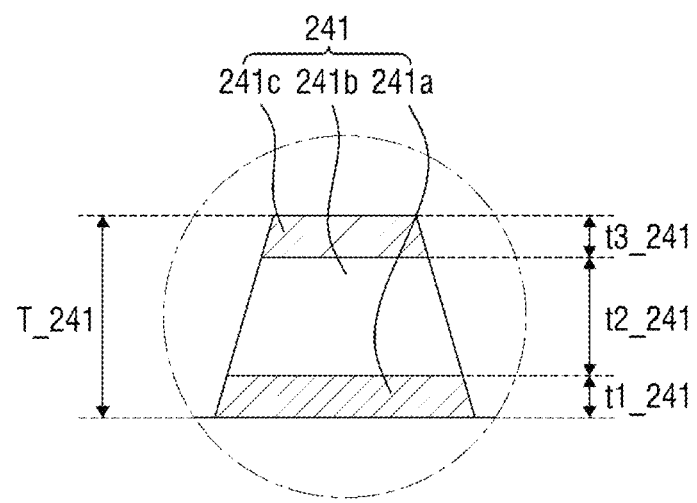

A plurality of diffraction patterns 240 will be described on the basis of a first diffraction pattern 241 of a display device 40 with reference to FIGS. 24A and 24B.

The first diffraction pattern 241 may include a first refractive layer 241a, a second refractive layer 241b, and a third refractive layer 241c which are sequentially stacked. The first to third refractive layers 241a to 241c may have different widths. More specifically, a width of the first refractive layer 241a may be greater than widths of the second refractive layer 241b and the third refractive layer 241c. That is, the plurality of diffraction patterns 240 of the diffraction panel 200_5 illustrated in FIG. 24A differ from the plurality of diffraction patterns 210 illustrated in FIG. 1A in that a cross-sectional shape thereof is a tapered shape.

A refractive index and a thickness t1_241 of the first refractive layer 241a and a refractive index and a thickness t3_241 of the third refractive layer 241c may be determined to sufficiently reduce reflectance of the first diffraction pattern 241 and may be determined in consideration of refractive indexes or thicknesses of other components, for example, the second refractive layer 241b, the base layer 220, and the protective layer 230. In an exemplary embodiment, a thickness t2_241 of the second refractive layer 241b may be the thickest. Also, in an exemplary embodiment, a third thickness T_241 may be the same as the first thickness T1 illustrated in FIG. 1A.

Figure 25A:
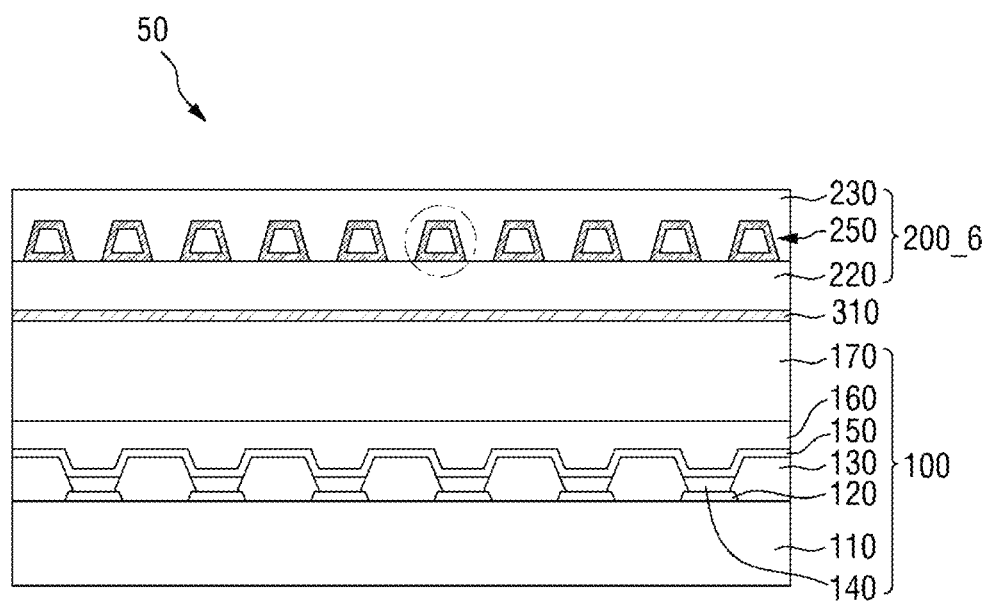
Figure 25B:
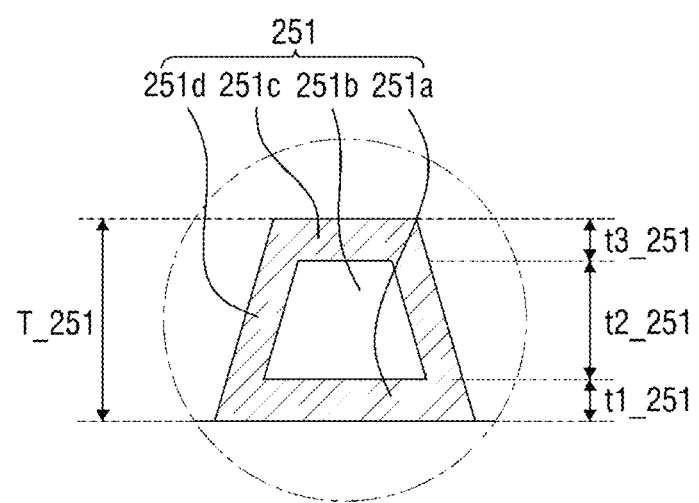

Referring to FIG. 25B, in a display device 50, a first diffraction pattern 251 of the plurality of diffraction patterns 250 of the diffraction panel 200_6 may include a first refractive layer 251a, a second refractive layer 251b, and a third refractive layer 251c which are sequentially stacked. Also, the first diffraction pattern 251 may further include a fourth refractive layer 251d which is in contact with both side surfaces of the second refractive layer 251b. Accordingly, the first refractive layer 251a, the third refractive layer 251c, and the fourth refractive layer 251d may be provided to surround the second refractive layer 251b. In an exemplary embodiment, the first refractive layer 251a, the third refractive layer 251c, and the fourth refractive layer 251d may include the same material. Accordingly, refractive indexes of the first refractive layer 251a, the third refractive layer 251c, and the fourth refractive layer 251d may be the same. In an exemplary embodiment, the second refractive layer 251b may have a tapered cross section.

Thicknesses t1_251, t2_251, and t3_251 of the first to third refractive layers 251a to 251c for satisfying the above-described Expression 6 may be determined as those illustrated in FIG. 25B. Also, in an exemplary embodiment, a fourth thickness T_251 may be the same as the first thickness T1 illustrated in FIG. 1A.

Figure 26:
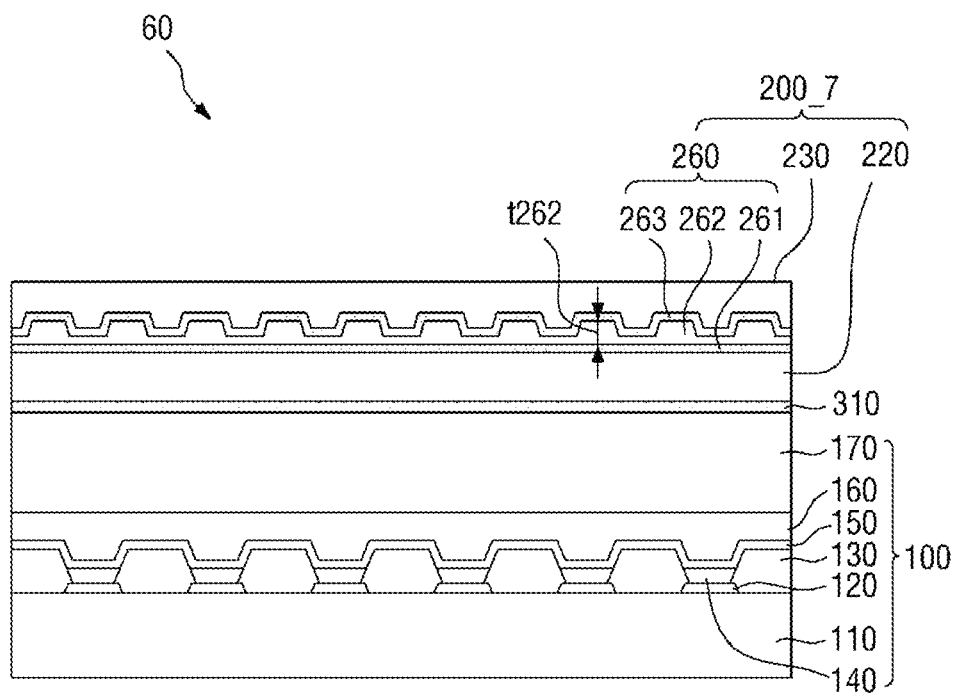

Referring to FIG. 26, in a display device 60, a plurality of diffraction patterns 260 of diffraction panel 200_7 may have a shape in which a first layer 261, a second layer 262, and a third layer 263 are sequentially stacked. In an exemplary embodiment, the plurality of diffraction patterns 260 may have a shape in which a plurality of trapezoidal shapes is connected in the cross-sectional view.

The above-described Expression 6 is changed to the following Expression 9 in the illustrated exemplary embodiment.

$$(m*\lambda_{L1})-60 \text{ (nm)} \leq A \leq (m*\lambda_{L1})+60 \text{ (nm)}$$

$$A \neq \{(n230-n262) \times t262\} \quad \text{[Expression 9]}$$

Here, $\lambda_{L1}$ denotes a wavelength of light incident on one of the plurality of OLEDs 140, and n230 denotes the refractive index of the protective layer 230. Further, n262 denotes a refractive index of the second layer 262, and t262 denotes a thickness of the second layer 262. A unit of A is nm, and m is an integer equal to or greater than 0.

That is, in the exemplary embodiment illustrated in FIG. 26, when the thickness t262 and the refractive index of the second layer 262 satisfy Expression 9, luminance of at least one light emission pattern of the plurality of replicated light emission patterns P1 to P8 may be about 3% or more of the luminance of the reference light emission pattern Pref.

Figure 27:
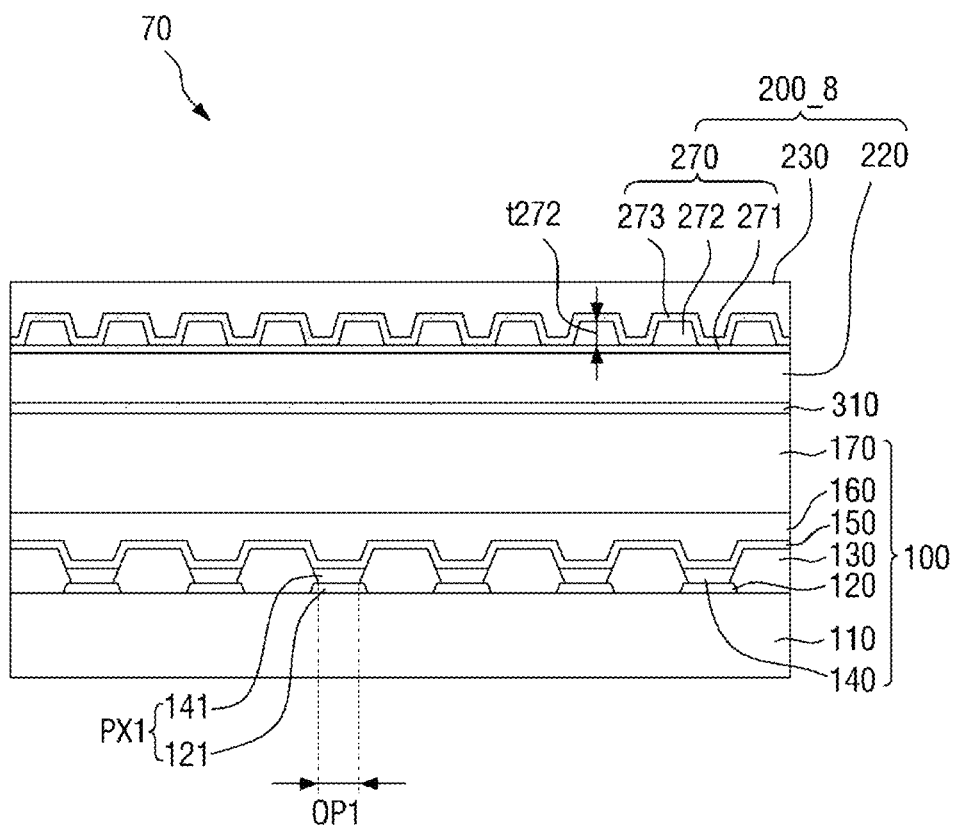

Referring to FIG. 27, unlike the second layer 262 illustrated in FIG. 26, in a second layer 272 of a plurality of diffraction patterns 270 of diffraction panel 200_8 of a display device 70 illustrated in FIG. 27, adjacent second layers are not in contact with each other. Accordingly, a first layer 271 and a third layer 273 may be in direct contact with each other.

In the exemplary embodiment illustrated in FIG. 27, when a thickness t272 and a refractive index of the second layer 272 satisfy the following Expression 10, luminance of at least one light emission pattern of the plurality of replicated light emission patterns P1 to P8 may be about 3% or more of the luminance of the reference light emission pattern Pref.

$$(m*\lambda_{L1})-60 \text{ (nm)} \leq A \leq (m*\lambda_{L1})+60 \text{ (nm)}$$

$$A \neq \{(n230-n272) \times t272\} \quad \text{[Expression 10]}$$

Here, $\lambda_{L1}$ denotes a wavelength of light incident on one of the plurality of OLEDs 140, and n230 denotes the refractive index of the protective layer 230. Further, n272 denotes the refractive index of the second layer 272, and t272 denotes the thickness of the second layer 272. A unit of A is nm, and m is an integer equal to or greater than 0.

Figure 28:
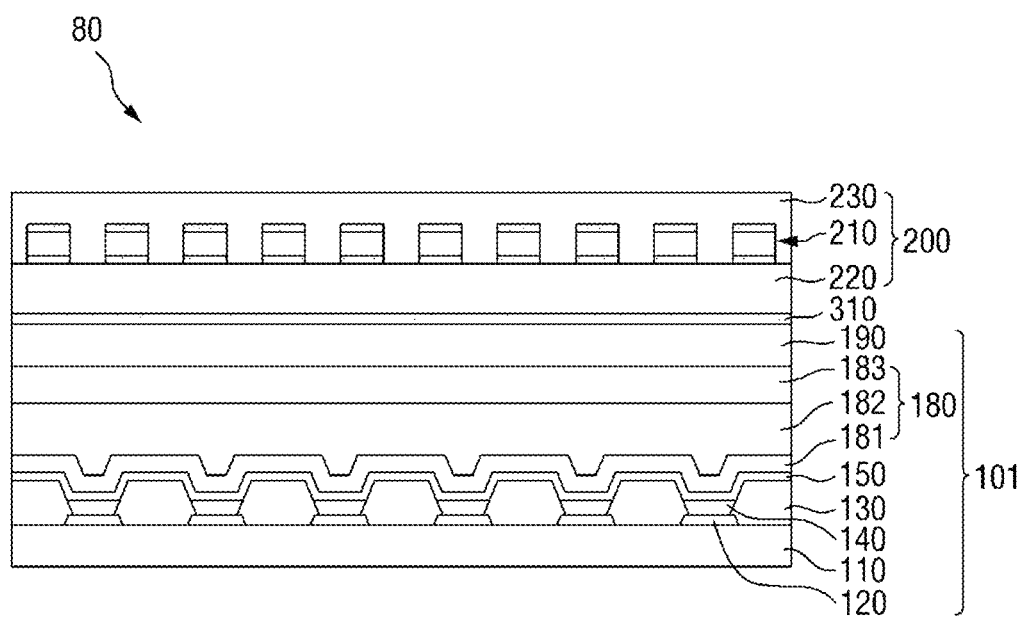
FIG. 28 is a cross-sectional view illustrating another exemplary embodiment of a display device according to the invention.

FIG. 28 is a cross-sectional view illustrating a display device according to yet another exemplary embodiment of the invention. However, descriptions identical to those given in FIGS. 1A to 27 will be omitted.

A display device 80 according to yet another exemplary embodiment of the invention may include a display panel 101 and a diffraction panel 200. That is, the display device 80 illustrated in FIG. 28 differs from the display device 10 illustrated in FIG. 1A in that the first encapsulation layer 170 is replaced by a second encapsulation layer 180.

The display panel 101 may include the second encapsulation layer 180 and a second buffer layer 190.

In an exemplary embodiment, the second encapsulation layer 180 may have a structure in which at least one of an organic layer and an inorganic layer form a single layer or are stacked in a multilayer. More specifically, the second encapsulation layer 180 may include a first inorganic layer 181, an organic layer 182, and a second inorganic layer 183.

The first inorganic layer 181 may be disposed on a common electrode 150. In an exemplary embodiment, the first inorganic layer 181 may include at least one of silicon oxide (SiOx), silicon nitride (SiNx), and silicon oxynitride (SiONx), for example.

The organic layer 182 may be disposed on the first inorganic layer 181. In an exemplary embodiment, the organic layer 182 may include at least one of epoxy, acrylate, and urethane acrylate, for example. The organic layer 182 may planarize a step caused by a pixel definition film 130.

The second inorganic layer 183 may be disposed on the organic layer 182. In an exemplary embodiment, the second inorganic layer 183 may include at least one of silicon oxide (SiO$_x$), silicon nitride (SiN$_x$), and silicon oxynitride (SiON$_x$), for example.

In FIG. 28, each of the first inorganic layer 181, the organic layer 182, and the second inorganic layer 183 is illustrated as being a single layer, but the invention is not limited thereto. That is, at least one of the first inorganic layer 181, the organic layer 182, and the second inorganic layer 183 may be stacked in a multilayer structure.

In another exemplary embodiment, the second encapsulation layer 180 may include a hexamethyldisiloxane ("HMDSO") layer. More specifically, the second encapsulation layer 180 may include the first inorganic layer 181, the second inorganic layer 183, and an HMDSO layer disposed between the first inorganic layer 181 and the second inorganic layer 183. That is, the above-described the organic layer 182 may be replaced by an HMDSO layer.

In an exemplary embodiment, the HMDSO layer may be provided through the same chamber after forming the first inorganic layer 181. Accordingly, a process of forming the second encapsulation layer 180 may be simplified. Also, the second encapsulation layer 180 includes the HMDSO layer capable of absorbing stress, and thus the second encapsulation layer 180 may have sufficient flexibility.

The second buffer layer 190 may be disposed on the second inorganic layer 183. There are no specific limitations on a material of the second buffer layer 190. That is, the second buffer layer 190 may include an inorganic material or an organic material. In an alternative exemplary embodiment, the second buffer layer 190 may have a structure in which at least one of an organic layer and an inorganic layer form a single layer or are stacked in a multilayer, for example. The second buffer layer 190 has a predetermined thickness, and thus a plurality of OLEDs 140 and the diffraction panel 200 may be spaced a predetermined distance from each other. That is, separation distances between the plurality of OLEDs 140 and the plurality of diffraction patterns 210 may be controlled by controlling a thickness of the second buffer layer 190. Accordingly, this means that the diffraction distance may be controlled. In an exemplary embodiment, the thickness of the second buffer layer 190 may be equal to or less than about 200 μm, for example. In another exemplary embodiment, the second buffer layer 190 may be omitted. In this case, a separation distance between the plurality of OLEDs 140 and the diffraction panel 200 may not be sufficiently secured. When the separation distances between the plurality of OLEDs 140 and the diffraction panel 200 are not sufficiently secured, a desired diffraction distance is not provided and an effect of an enlargement of the effective light emission area ratio may be lowered. Therefore, in the case in which the second buffer layer 190 is omitted, the separation distances between the plurality of OLEDs 140 and the diffraction panel 200 may be sufficiently secured by changing an arrangement order of the diffraction panel 200 and other components (e.g., an anti-reflection panel or an input sensing panel).

Figure 29:
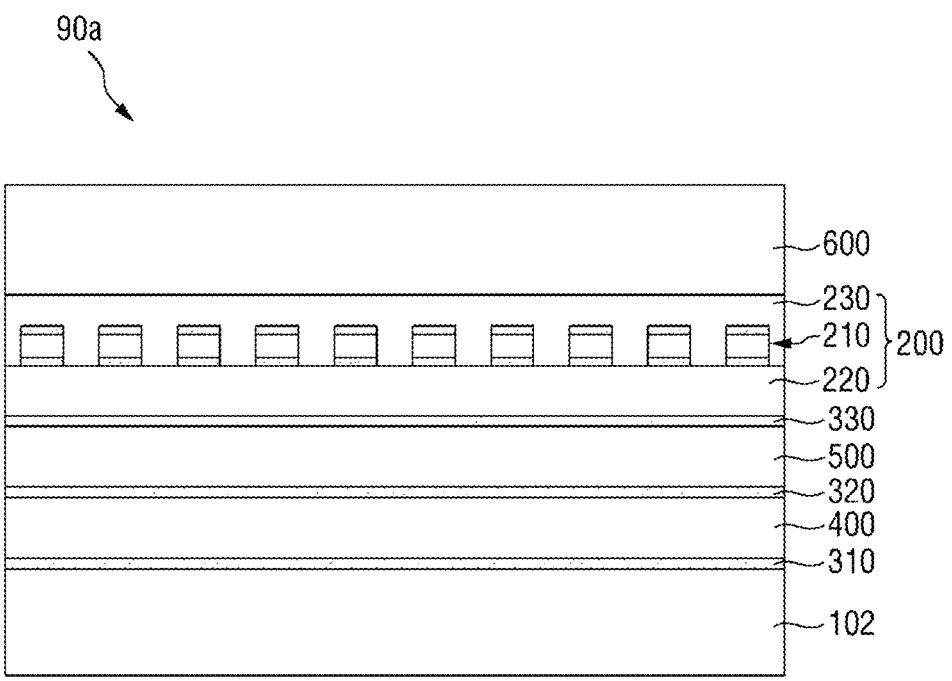
FIGS. 29 and 30 are cross-sectional views illustrating other exemplary embodiments of display devices according to the invention.
Figure 30:
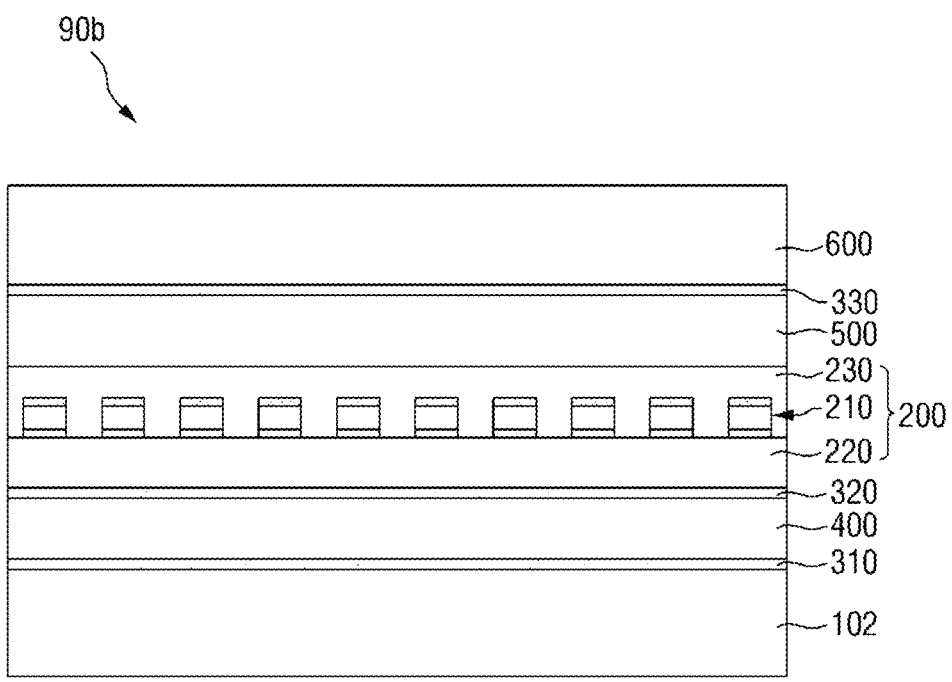

FIGS. 29 and 30 are cross-sectional views illustrating display devices according to other exemplary embodiments of the invention. However, descriptions identical to those given in FIGS. 1A to 28 will be omitted. In FIGS. 29 and 30, display panels will be referred to with a reference numeral 102. The display panels 102 illustrated in FIGS. 29 and 30 may be the display panel 100 illustrated in FIG. 1A or the display panel 101 illustrated in FIG. 28.

Referring to FIG. 29, a display device 90*a* according to yet another exemplary embodiment of the invention may include an input sensing panel 400, an anti-reflection panel 500, and a window panel 600.

The input sensing panel 400 may be disposed on the display panel 102. The input sensing panel 400 may be coupled to the display panel 102 through a first adhesive member 310. The first adhesive member 310 may be a PSA member. The input sensing panel 400 may obtain coordinate information through an external input, for example, a touch or the like. That is, in an exemplary embodiment, the input sensing panel 400 may be a touch panel which senses a user's touch or a fingerprint sensing panel which obtains fingerprint information of a user's finger.

In an exemplary embodiment, the input sensing panel 400 may sense an external input in a capacitive manner. Here, there are no specific limitations on the input sensing method. In an exemplary embodiment, the input sensing panel 400 may sense an external input through an electromagnetic induction method or a pressure sensing method.

In FIG. 29, the input sensing panel 400 is illustrated as overlapping the entire display panel 102, but the invention is not limited thereto. That is, the input sensing panel 400 may overlap only a portion of the display panel 102, for example, at least a portion of a display region which displays an image. In an alternative exemplary embodiment, the input sensing panel 400 may overlap a non-display region which does not display an image, for example.

Also, the input sensing panel 400 may be an input sensing layer which is disposed on the display panel 102 through a continuous process. When the input sensing layer is disposed on the display panel 102, the first adhesive member 310 may be omitted.

The anti-reflection panel 500 may be disposed on the input sensing panel 400. In an exemplary embodiment, the anti-reflection panel 500 may be coupled to the input sensing panel 400 through a second adhesive member 320. Here, in an exemplary embodiment, the second adhesive member 320 may be a PSA member. However, the invention is not limited thereto, and in another exemplary embodiment, the second adhesive member 320 may be an OCA member. In an alternative exemplary embodiment, the second adhesive member 320 may be an OCR film, for example.

The anti-reflection panel 500 may reduce reflectance of external light incident from an upper side of the window panel 600, which will be described below. In an exemplary embodiment, the anti-reflection panel 500 may include a phase retarder and a polarizer.

In an exemplary embodiment, the phase retarder may be a film type phase retarder or a liquid crystal coating type phase retarder. In an alternative exemplary embodiment, the phase retarder may include a λ/2 phase retarder and/or a λ/4 phase retarder, for example. In an exemplary embodiment, the polarizer the polarizer may be a film type polarizer or a liquid crystal coating type polarizer. Here, the film type polarizer may include a stretch-type synthetic resin film. The liquid crystal coating type polarizer may include liquid crystals disposed in a predetermined array. In an exemplary embodiment, the phase retarder and the polarizer may further include a protective film. Each of the phase retarder and the polarizer itself may be defined as a base layer of the anti-reflection panel 500. When each of the phase retarder and the polarizer further includes a protective film, the protective film may be defined as the base layer of the anti-reflection panel 500.

The diffraction panel 200 may be disposed on the anti-reflection panel 500. The diffraction panel 200 may be coupled to the anti-reflection panel 500 through a third adhesive member 330. In an exemplary embodiment, the third adhesive member 330 may be a PSA member. However, the invention is not limited thereto, and in another exemplary embodiment, the third adhesive member 330 may be an OCA member. In an alternative exemplary embodiment, the third adhesive member 330 may be an OCR film, for example.

The input sensing panel 400 and the anti-reflection panel 500 may be disposed between the diffraction panel 200 and the display panel 102, and thus an optical distance, which is defined as a distance between the display panel 102 and the diffraction panel 200, may be sufficiently secured.

As described above, the anti-reflection panel 500 may reduce reflectance due to external light. However, when the diffraction panel 200 is disposed on the anti-reflection panel 500, reflection of external light by the plurality of diffraction patterns 210 included in the diffraction panel 200 occurs. However, the diffraction panel 200 includes the plurality of diffraction patterns 210 in which a plurality of refractive layers having different refractive indexes are stacked, and thus the reflectance may be reduced.

Accordingly, the display device 90a according to yet another exemplary embodiment of the invention may reduce reflectance due to external light being provided to the diffraction panel 200 while securing a sufficient optical distance.

The window panel 600 may be disposed on the diffraction panel 200. In an exemplary embodiment, the window panel 600 may be coupled to the diffraction panel 200 through the protective layer 230. In an alternative exemplary embodiment, the window panel 600 may be coupled to the diffraction panel 200 through a separate adhesive member, for example.

A display device 90b illustrated in FIG. 30 differs from the display device 90a illustrated in FIG. 29 in that locations of the diffraction panels 200 are different.

That is, referring to FIG. 30, the diffraction panel 200 may be disposed on the input sensing panel 400, and the anti-reflection panel 500 may be disposed on the diffraction panel 200. The anti-reflection panel 500 and the window panel 600 may be coupled to each other through the third adhesive member 330.

Reflectance due to external light may be further reduced by disposing the anti-reflection panel 500 on the diffraction panel 200. However, as an optical distance between the diffraction panel 200 and the display panel 102 is reduced, a desired diffraction distance is not provided, and an effect of an enlargement of an effective light emission area ratio may be reduced. In order to prevent this, in an exemplary embodiment, the display panel 102 may further include a buffer layer for securing the optical distance. In another exemplary embodiment, when the display panel 102 is the display panel 101 illustrated in FIG. 1A, the display panel 102 includes the first encapsulation layer 170 having a relatively large thickness, and thus the optical distance may be secured. In still another exemplary embodiment, when the display panel 102 is the display panel 101 illustrated in FIG. 28, the optical distance may be secured by increasing the thickness of the second buffer layer 190.

In FIGS. 29 and 30, although the input sensing panel 400 is illustrated as being located at a level relatively lower than that of the anti-reflection panel 500, the invention is not limited thereto. That is, the input sensing panel 400 may be disposed on the anti-reflection panel 500.

Figure 31A:
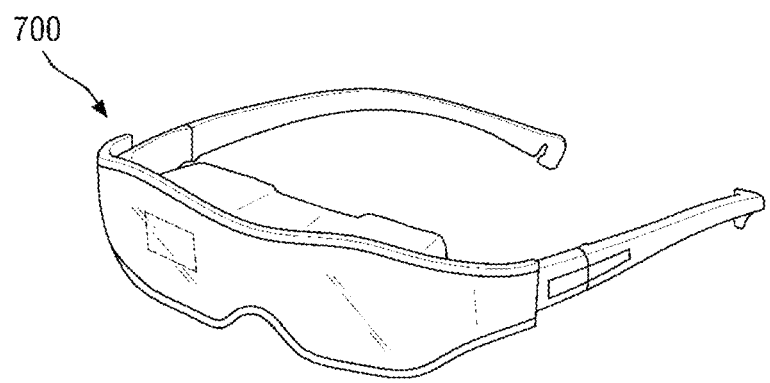
FIGS. 31A and 31B are views illustrating a head mount display device including the display device illustrated in FIG. 1.
Figure 31B:
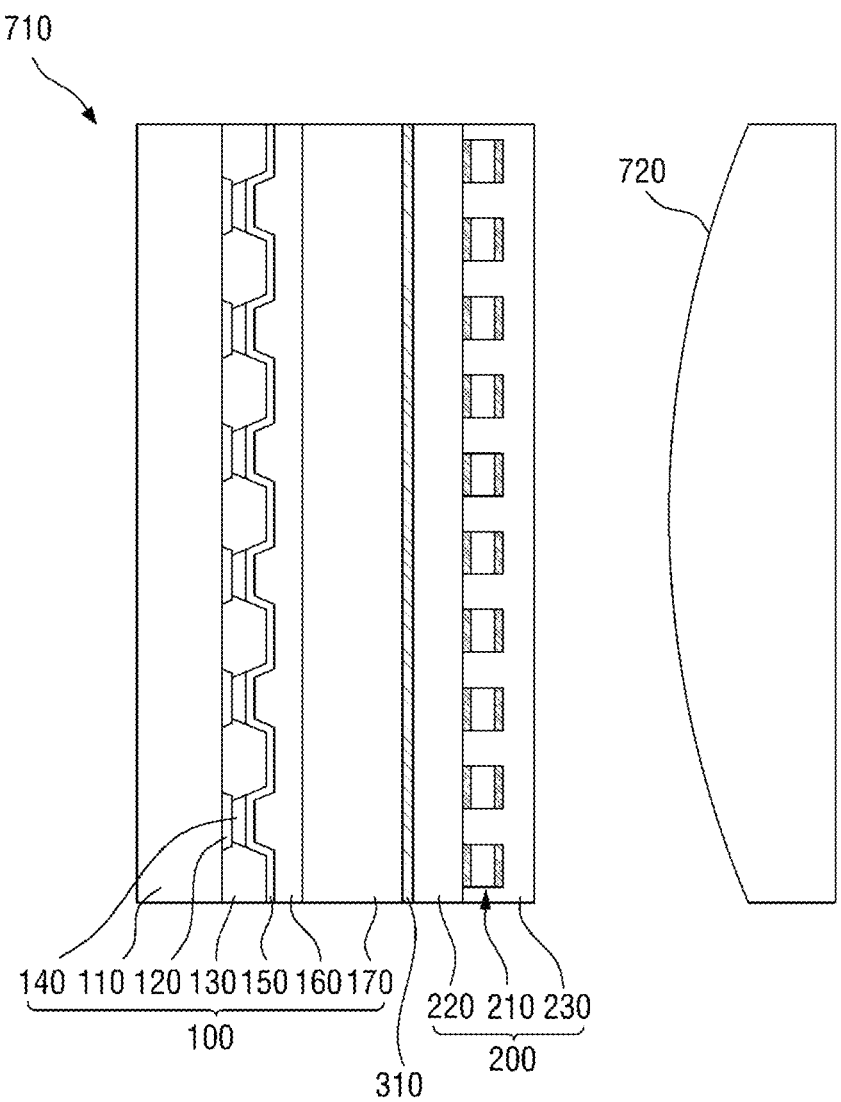
Figure 32:
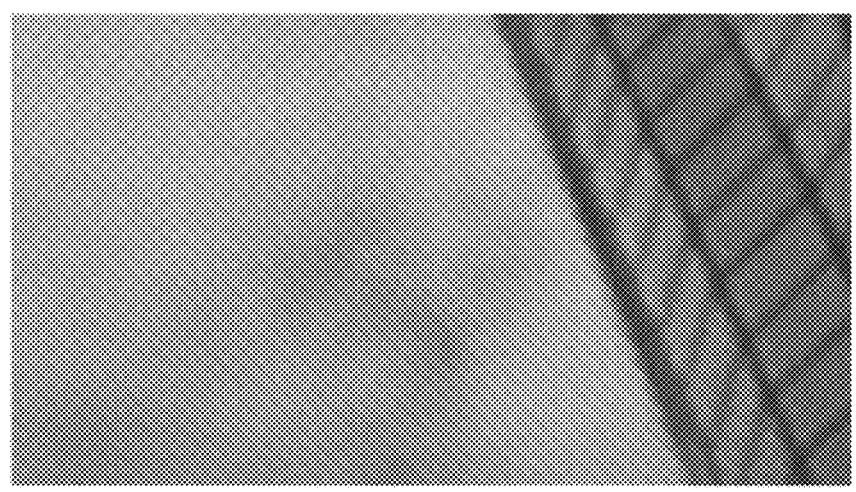
FIG. 32 is a view illustrating a conventional technology of a screen door phenomenon in a head mount display device.
Figure 33:
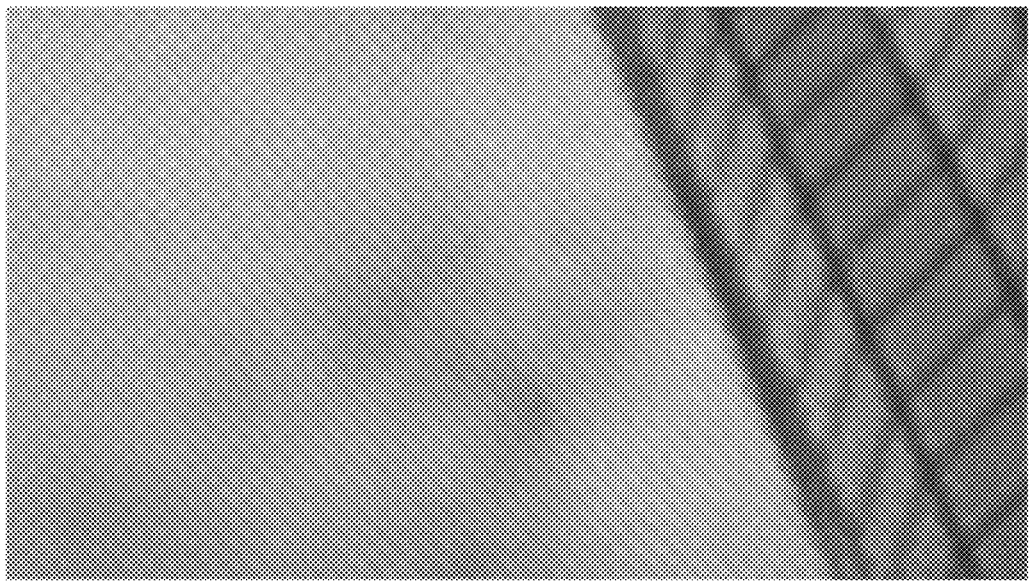
FIG. 33 is a view illustrating an exemplary embodiment of an improved screen door phenomenon in the head mount display device according to the invention.

FIGS. 31A and 31B are views illustrating a head mount display device including the display device illustrated in FIG. 1A. FIG. 32 is a view illustrating a screen door phenomenon in a head mount display device according to a conventional technology. FIG. 33 is a view illustrating an improved screen door phenomenon in the head mount display device according to an exemplary embodiment of the invention.

Referring to FIGS. 1A, 31A and 31B, the head mount display device 700 according to the exemplary embodiment of the invention may include a display unit 710 and a lens unit 720. Although not illustrated in the drawings, the head mount display device 700 according to the exemplary embodiment of the invention may further include a camera, an infrared sensor, a signal processing unit, and a frame that may be mounted (e.g., disposed) on a user's head.

The lens unit 720 may receive light from the display unit 710. In an exemplary embodiment, the lens unit 720 may be disposed between an object and the user. In an exemplary embodiment, the lens unit 720 may be provided with an opaque lens to realize virtual reality. In another exemplary embodiment, the lens unit 720 may be provided with a transparent lens or a translucent lens to realize augmented reality. In an exemplary embodiment, the lens unit 720 may be a convex lens.

The display unit 710 may correspond to the display device 10 illustrated in FIG. 1A. That is, the display unit 710 may include the display panel 100 and the diffraction panel 200. An effective light emission area may be enlarged due to a phenomenon of interference of light that may be generated by light which is emitted from the plurality of OLEDs 140 included in the display panel 100 and passes through the diffraction panel 200.

An image of the display unit 710 may be enlarged by the lens unit 720 so that the user may view the enlarged image. However, a screen door effect ("SDE") may occur due to an enlarged environment. That is, for example, a boundary with the pixel definition films 130 (refer to FIG. 1) may be visually recognized by the user due to the enlarged environment. However, a region visually recognized by the user due to the enlarged environment corresponds to a non-emission region.

As described above, the effective light emission area ratio refers to a ratio of a light emission region in one region. An increase of the effective light emission area ratio refers to an increase of an area of the light emission region. This may be expressed as a decrease of an area of the non-emission region.

That is, in the head mount display device 700 according to an exemplary embodiment of the invention, the area of the non-emission region may be reduced and the area of the non-emission region visually recognized by the user due to the enlarged environment may be reduced. Accordingly, the SDE may be improved.

Referring to FIG. 32, it may be seen that an interval between the pixel definition films 130 (refer to FIG. 1) and the like are visually recognized as a web. That is, it may be seen that a SDE is visually recognized. Referring to FIG. 33, it may be seen that a degree of visual recognition of the interval with the pixel definition film 130 is improved in comparison to that in FIG. 32. In FIG. 31, although the display unit 710 is described as including the display panel 100 illustrated in FIG. 1A, the invention is not limited thereto. That is, the display unit 710 may include the display panel 101 illustrated in FIG. 28.

Figure 34:
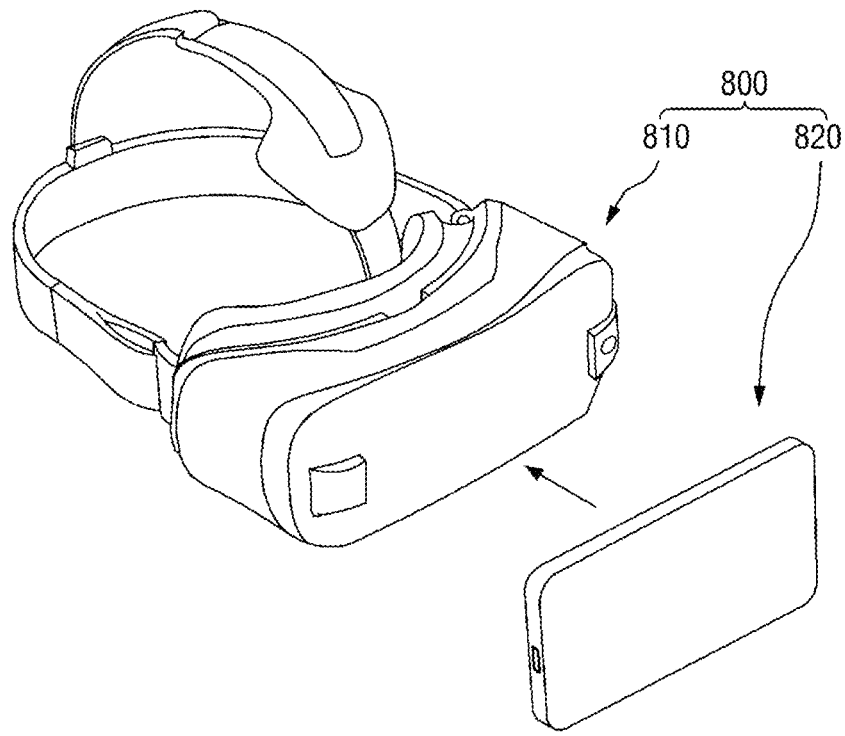
FIG. 34 is a view illustrating another exemplary embodiment of a head mount display device according to the invention.

FIG. 34 is a view illustrating a head mount display device according to another exemplary embodiment of the invention.

Referring to FIG. 34, a head mount display device 800 according to another exemplary embodiment of the invention may include a head mount device 810 and a display device 820.

The head mount device 810 may be coupled to the display device 820. Here, the display device 820 may include a display panel having a plurality of display elements which display an image and a diffraction panel which diffracts light emitted from the display elements. That is, the display device 820 may include one of the display devices described in this specification.

The head mount device 810 may include a connector for electrical connection with the display device 820 and a frame for physical connection therewith. Also, the head mount device 810 may include a cover for preventing an external impact and preventing separation of the display device 820.

That is, the head mount device 810 may be coupled to the display device 820, the display device 820 may include the diffraction panel, and thus an effective light emission area thereof may be enlarged to improve a screen door phenomenon.

According to the exemplary embodiments of the invention, an effective light emission area ratio may be increased.

In addition, reflectance due to external light may be reduced.

Further, a degree of visual blurring recognition may be minimized.

Furthermore, in a head mount display device, an SDE may be improved.

What is claimed is:

1. A display device comprising:
a display panel comprising a substrate and a plurality of display elements disposed on the substrate;
an anti-reflection panel including a polarizer on the display panel;
a diffraction panel on the anti-reflection panel,
wherein the diffraction panel includes a plurality of diffraction patterns having at least one refractive layer, and a space between the plurality of diffraction patterns, and
wherein each of the plurality of diffraction patterns has a same thickness.

2. The display device of claim 1, wherein the plurality of diffraction patterns are isolated from each other.

3. The display device of claim 1, wherein the space extends a first direction and a second direction perpendicular to the first direction.

4. The display device of claim 1, wherein a diffraction pattern of the plurality of diffraction patterns includes:
a first layer; and
a second layer disposed on the first layer,
wherein a refractive index of the second layer is different from a refractive index of the first layer.

5. The display device of claim 4, wherein the diffraction pattern further includes a third layer disposed on the second layer.

6. The display device of claim 5, wherein a refractive index of the second layer is higher than a refractive index of the first layer and a refractive index of the third layer.

7. The display device of claim 5, wherein the diffraction pattern further includes a fourth layer which is in contact with both side surfaces of the second layer.

8. The display device of claim 7, wherein the first layer, the third layer, and the fourth layer surround the second layer.

9. The display device of claim 7, wherein a refractive index of the second layer is higher than a refractive index of the first layer, a refractive index of the third layer, and a refractive index of the fourth layer.

10. The display device of claim 7, a second thickness of the second layer is larger than a first thickness of the first layer, a third thickness of the third layer, and a fourth thickness of the fourth layer.

11. The display device of claim 10, further comprising:
a protective layer on the plurality of diffraction patterns, wherein the first thickness, the second thickness, and the third thickness satisfy a following Expression 1:

$$(m^*\lambda_{L1})-60 \text{ (nm)} \leq A \leq (m^*\lambda_{L1})+60 \text{ (nm)}$$

$$U=[\{(n230-n211c) \times t3\}+[\{(n230-n211b) \times t2\}+(n230-n211a) \times t1)]$$

$$A \neq U \quad \text{[Expression 1]}$$

(in the Expression 1, $\lambda_{L1}$ denotes a wavelength of a light emitted from a display element among the plurality of display elements, n211a denotes the refractive index of the first layer, n211b denotes the refractive index of the second layer, n211c denotes the refractive index of the third layer, n230 denotes a refractive index of the protective layer, units of U and A are nm, and m is an integer equal to or greater than 0.)

12. The display device of claim 10, wherein a fourth thickness of the fourth layer is same as the first thickness.

13. The display device of claim 6, wherein the first layer, the second layer, and the third layer are sequentially stacked, and a second thickness of the second layer is larger than a first thickness of the first layer and a third thickness of the third layer.

14. The display device of claim 6, wherein the plurality of diffraction patterns have a shape in which a plurality of trapezoidal shapes are connected in the cross-sectional view.

15. The display device of claim 12, further comprising:
a protective layer on the plurality of diffraction patterns, wherein a second thickness of the second layer satisfies a following Expression 2:

$$(m^*\lambda_{L1})-60 \text{ (nm)} \leq A \leq (m^*\lambda_{L1})+60 \text{ (nm)}$$

$$A \neq \{(n230-n262) \times t262\} \quad \text{[Expression 2]}$$

(in the Expression 2, $\lambda_{L1}$ denotes a wavelength of a light emitted from a display element among the plurality of display elements, n262 denotes a refractive index of the second layer, t262 denotes the second thickness, n230 denotes a refractive index of the protective layer, A unit of A is nm, and m is an integer equal to or greater than 0.)

16. The display device of claim 6, wherein the second layer is spaced apart from another second layer,
the first layer and the third layer are in contact with each other between the second layer and the another second layer.

17. The display device of claim 16, wherein a second thickness of the second layer is larger than a first thickness of the first layer and a third thickness of the third layer.

18. The display device of claim 16, further comprising:
a protective layer on the plurality of diffraction patterns, wherein a second thickness of the second layer satisfies a following Expression 3:

$$(m^*\lambda_{L1})-60 \text{ (nm)} \leq A \leq (m^*\lambda_{L1})+60 \text{ (nm)}$$

$$A \neq \{(n230-n272) \times t272\} \quad \text{[Expression 3]}$$

(in the Expression 3, $\lambda_{L1}$ denotes a wavelength of a light emitted from a display element among the plurality of display elements, n272 denotes a refractive index of the second layer, t272 denotes the second thickness, n230 denotes a refractive index of the protective layer, A unit of A is nm, and m is an integer equal to or greater than 0.)

19. The display device of claim 1, wherein the anti-reflection panel further includes a phase retarder.

20. The display device of claim 1, further comprising:
an input sensing panel between the display panel and the anti-reflection panel to obtain coordinate information through an external input.

\* \* \* \* \*